(12) United States Patent
Shen et al.

(10) Patent No.: US 7,401,283 B2
(45) Date of Patent: Jul. 15, 2008

(54) AMPLIFYING MAGNITUDE METRIC OF RECEIVED SIGNALS DURING ITERATIVE DECODING OF LDPC (LOW DENSITY PARITY CHECK) CODE AND LDPC CODED MODULATION

(75) Inventors: Ba-Zhong Shen, Irvine, CA (US); Kelly Brian Cameron, Irvine, CA (US); Scott Richard Powell, Carlsbad, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 562 days.

(21) Appl. No.: 11/190,334

(22) Filed: Jul. 27, 2005

(65) Prior Publication Data

US 2006/0107179 A1 May 18, 2006

Related U.S. Application Data

(60) Provisional application No. 60/627,452, filed on Nov. 12, 2004, provisional application No. 60/613,923, filed on Sep. 28, 2004.

(51) Int. Cl.
*H03M 13/00* (2006.01)
(52) U.S. Cl. .................................... 714/758; 714/752
(58) Field of Classification Search ................ 714/758, 714/752, 786, 796, 790, 792, 755; 375/265, 375/298, 316, 329
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 7,246,304 B2 * | 7/2007 | Kim ........................... | 714/801 |
| 2003/0104788 A1 | 6/2003 | Kim | |
| 2004/0153960 A1 * | 8/2004 | Eroz et al. .................. | 714/800 |

OTHER PUBLICATIONS

R. G. Gallager, "Low density parity check codes," IRE Trans. Info. Theory, vol. IT-8, pp. 21-28, Jan. 1962.

(Continued)

*Primary Examiner*—Jacques Louis-Jacques
*Assistant Examiner*—Fritz Alphonse
(74) *Attorney, Agent, or Firm*—Garlick Harrison & Markison; Shayne X. Short

(57) ABSTRACT

Amplifying magnitude metric of received signals during iterative decoding of LDPC code and LDPC coded modulation. By appropriately selecting a metric coefficient value that is used to calculate the initial conditions when decoding LDPC coded signals, a significant reduction in BER may be achieved at certain SNRs. The appropriate selection of the metric coefficient value may be performed depending on the particular SNR at which a communication system is operating. By adjusting this metric coefficient value according to the given LDPC code, modulation, and noise variance, the overall performance of the decoding may be significantly improved. The convergence speed is slowed down so that the decoder will not go to the wrong codeword, and the moving range of the outputs of the decoder is restricted so that the output will not oscillate too much and will eventually move to the correct codeword.

28 Claims, 21 Drawing Sheets

OTHER PUBLICATIONS

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

"Performance evaluation of low latency LDPC code," Katsutoshi Seki of NEC Electronic (presented in IEEE P802.3an Task Force, Jul. 2004).

D. J. C. MacKay, "Good error Correcting codes based on very sparse matrices," IEEE Trans. Inform. Theory, vol. 45, pp. 399-431, Mar. 1999.

I. Djurdjevic, J. Xu, K. Abdel-Ghaffar and S. Lin, "A Class of Low-Density Parity-Check Codes Constructed Based on Reed-Solomon Codes With Two Information Symbols," IEEE Communications Letter, vol. 7, No. 7, pp. 317-319, Jul. 2003.

Lee-Fang Wei, "Generalized square and Hexagonal constellations for intersymbol-interference channels with generalized Tomlinson-Harashima precode," IEEE Trans. on Communications, vol. 42, No. 9, Sep. 1994, pp. 2713-2721.

* cited by examiner

AMPLIFYING MAGNITUDE METRIC OF RECEIVED SIGNALS DURING ITERATIVE DECODING OF LDPC (LOW DENSITY PARITY CHECK) CODE AND LDPC CODED MODULATION

CROSS REFERENCE TO RELATED PATENTS/PATENT APPLICATIONS

The present U.S. Utility patent application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/613,923, entitled "Improving iterative decoding of Low-Density Parity Check (LDPC) code and LDPC coded modulation by altering initial metric," filed Sep. 28, 2004.

2. U.S. Provisional Application Ser. No. 60/627,452, entitled "Amplifying magnitude metric of received signals during iterative decoding of Low-Density Parity Check (LDPC) code and LDPC coded modulation," filed Nov. 12, 2004.

BACKGROUND OF THE INVENTION

1. Technical Field of the Invention

The invention relates generally to communication systems; and, more particularly, it relates to decoding of signals employed in such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. Each of these different types of communication systems is able to achieve relatively low BERs (Bit Error Rates).

A continual and primary directive in this area of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. For example, the use of LDPC coded signals has been of significant concern within the IEEE (Institute of Electrical & Electronics Engineers) P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Clearly, there is a need in the art for some alternative coding type and modulation implementations that can provide near-capacity achieving error correction.

When considering a coding system that codes the binary information sequence to an LDPC codeword and then maps the LDPC codeword to constellation signals. These constellation signals may also be viewed as being modulation signals as well. A modulation may be viewed as being a particular constellation shape having a unique mapping of the constellation points included therein.

It may also be supposed that the channel noise is AWGN (Additive White Gaussian Noise) with noise variance, $\sigma^2$. Then, upon receiving the symbol, y, the probability of the transition from the signal, s, in the constellation is provided as follows:

$$P_s(y|s) = \frac{1}{\sigma\sqrt{2\pi}} \exp\left(\frac{-1}{2\sigma^2} D_{SE}(y,s)\right) \quad \text{(EQ 1A)}$$

where $D_{SE}(y,s)$ is the squared Euclidean distance between y and s. Based on this probability, the maximal likelihood decoding (MLD) tries all of the possible codewords with (EQ 1A) for all possible symbol, s, and finds the one codeword that has the maximal total probabilities. However, due to the inherent complexity of MLD, it is not possible with today's technology to carry out MLD when decoding LDPC coded signals.

One of the sub-optimal decoding approaches (with respect to decoding LDPC coded signals) is the iterative message passing (MP) (or belief propagation (BP)) decoding approach. In this approach, the above provided (EQ 1A) is used as a transition metric.

Since most useful LDPC codes have loops, the iterative decoding of such a code will cause oscillations. These oscillations may result from the fact that either the decoding will not be convergent, or it will converge to a wrong codeword.

In [a] "Performance evaluation of low latency LDPC code," Katsutoshi Seki of NEC Electronic (presented in *IEEE P802.3an Task Force*, July, 2004), by using the 2-dimensional noise variance in the metric computation with 1-dimensional noise, a surprise performance gain is obtained.

This document [a] is publicly available at the following Internet address:

[a] "http://www.ieee802.org/3/an/public/jul04/seki_1_0704.pdf"

The so-called 2-dimensional variance translated to the probability of the transition is provided as follows:

$$r(y, s) = \exp\left(\frac{-1}{4\sigma^2} D_{SE}(y, s)\right) \quad \text{(EQ 1B)}$$

When decoding LDPC coded signals, it is well known that before convergence is made to a codeword, the intermediate estimation of the MP decoding algorithm may oscillate. This is because the Hamming distance between estimated codeword and the actually sent codeword may not be decreasing monotonously. Thus, with limited number of iterations, such as 10 or less iterations, the "artificial error floor" may occur at higher SNR (Signal to Noise Ratio). Therefore, a LDPC decoder usually needs a larges number of iterations (e.g., 100 or more decoding iterations) before actual convergence may be achieved. However, to implement an LDPC decoder that requires this large number of decoding iterations is not practical for a system which needs to operate very fast and for which a primary design consideration is to provide for a relatively less costly decoder. As such, there is a need in the art for a means which could hopefully eliminate this artificial error floor that may sometimes occur when decoding LDPC coded signals.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
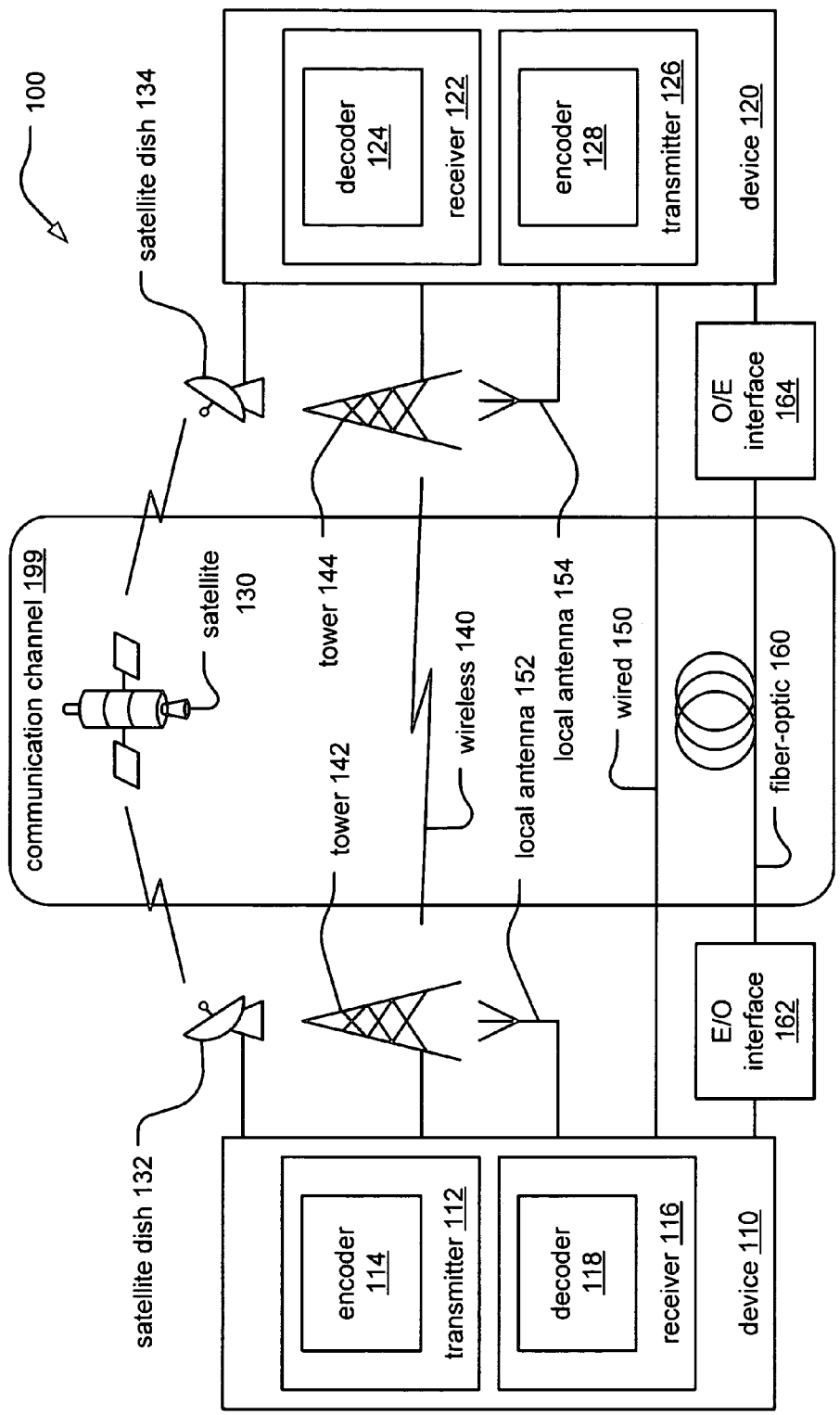
FIG. 1 and FIG. 2 are diagrams illustrating various embodiments of communication systems that may be built in accordance with certain aspects of the invention.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
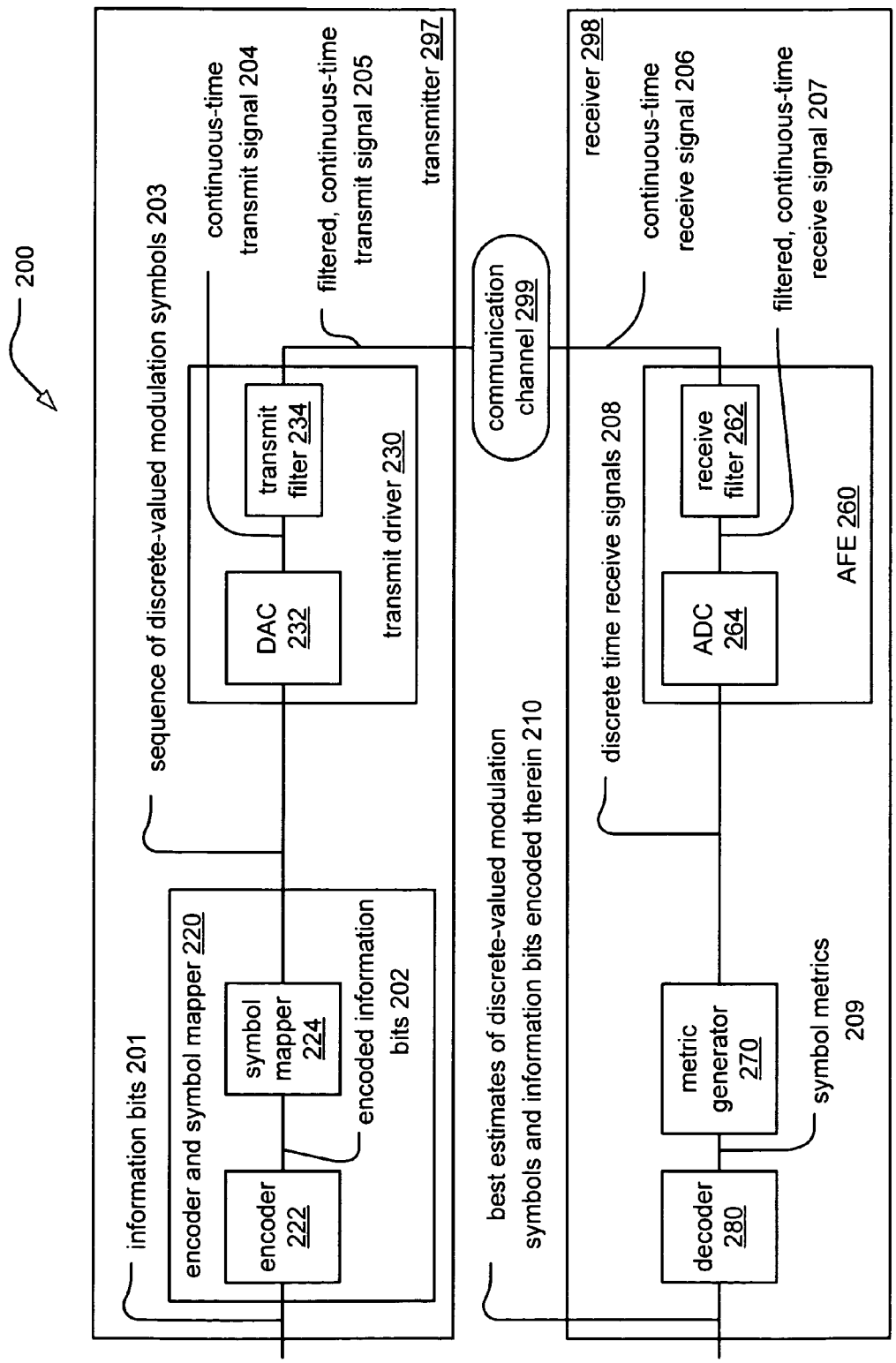

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The communication devices of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signals. Before more details are provided below, a general description of LDPC codes is provided.

Figure 3:
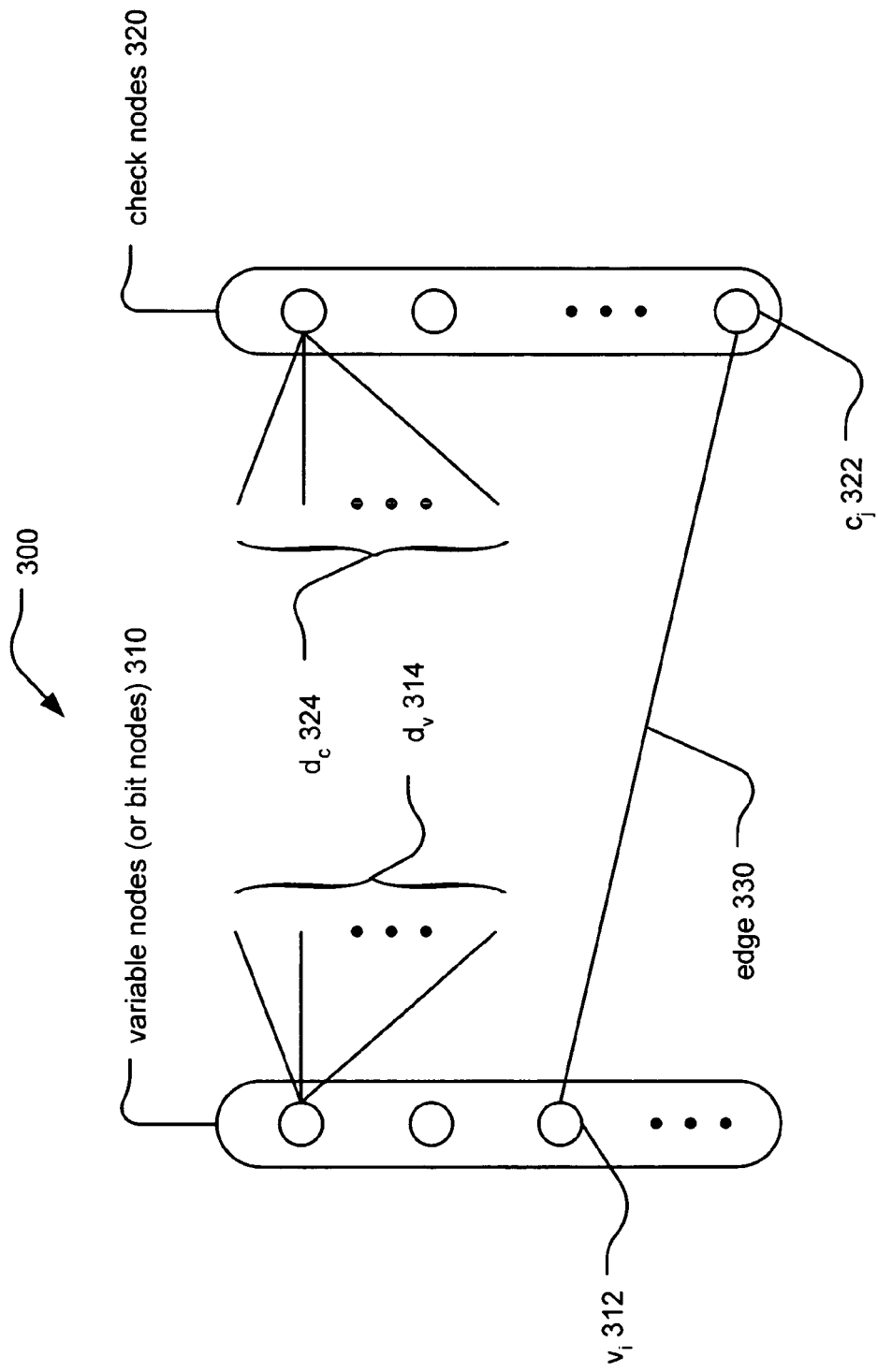
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, H= $(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes,* Cambridge, Mass.: MIT Press, 1963.

[2] M. Luby, M. Mitzenmacher, M. A. Shokrollahi, D. A. Spielman, and V. Stemann, "Practical Loss-Resilient Codes", Proc. $29^{th}$ Symp. on Theory of Computing, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory,* Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

A brief description of how LDPC coded signals may be decoded is provided below. This description is based on performing bit decoding of LDPC coded signals.

Again, an LDPC code may be defined by a binary parity check matrix, H, which has low-density of 1's (e.g., the binary parity check matrix is sparse). For example, $H=(h_{i,j})_{M \times N}$ may again be viewed as being a parity check matrix of an LDPC code with block length, N. The code can also be defined by a bipartite graph defined by, H, where the left side nodes representing the variable of a codeword bit; these left side nodes may be referred to as bit-nodes. The right hand side nodes of the LDPC bipartite graph represent the check equations; these right side nodes may be referred to as check nodes.

Every bit node has $d_b$ edges connecting between the bit node and some of the check-nodes, and every check node has exactly $d_c$ edges connecting between the check node to some of the variable nodes. That is to say, a given bit node has $d_b$ edges connecting from it to certain of the check nodes. Also, a given check node has $d_c$ edges connecting from it to certain of the bit nodes.

Define an edge between a bit-node $b_i$ and a check node $c_j$ by $e=(i,j)$. Alternatively, given an edge e, the nodes of this edge may be denoted by $e=(b(e),c(e))$. Given a bit-node $b_i$, the set of edges emitting from the bit-node $b_i$ may be defined by $E_b(i)=\{e|b(e)=i\}$. Given a check node $c_j$, the set of edges emitting from the node $c_j$ may be defined by $E_c(j)=\{e|c(e)=j\}$.

Suppose the received signal corresponding to the i-th bit is $y_i$. If this is the case, then the metric of bit-node $b_i$ corresponding to $y_i$ is defined by $metric_i(x)=p(y_i|b_i=x)$, where $x \in \{0,1\}$. To initialize the iterative decoding processing, the initial value be defined as follows:

$$M_b^0(x, e) = metric_{b(e)}(x).$$

1. Check node processing (from bit to check): this involves updating the edge messages with respect to the check nodes, $Medge_c$, using the edge messages with respect to the bit nodes, $Medge_b$. Alternatively, the edge messages with respect to the check nodes, $Medge_c$, may be referred to as $M_c^n$, and the edge messages with respect to the bit nodes, $Medge_b$, may be referred to as $M_b^n$.

The check node processing proceeds as follows:
For every edge e compute;

$$M_c^n(x, e) = \qquad\qquad\qquad\qquad\qquad\qquad (EQ\ 2)$$
$$P(c_{c(e)} = 0 \mid b_{v(e)} = x, y) = \sum_{u \in U_e(x)} \prod_{e' \in E_c(c(e)) \setminus \{e\}} M_b^{n-1}(u_{b(e')}, e');$$
where $$U_e(x) = \left\{ u_1 \in \{0, 1\}, (t, c(e)) \in E_c(c(e)) \setminus \{e\} \mid \sum_t u_t = x \right\}.$$

2. Bit node processing (from check to bit): this involves updating the edge messages with respect to the bit nodes, $Medge_b$ (or $M_b^n$), using the edge messages with respect to the check nodes, $Medge_c$ (or $M_c^n$) as well as the metric, $metric_{b(e)}(x)$.

The bit node processing proceeds as follows:
For every edge compute;

$$M_b^n(x, e) = P(b_{b(e)} = x \mid c_{c(e')} = 0, e' \in E_b(b(e)) \setminus \{e\}, y) \qquad (EQ\ 3)$$
$$= metric_{b(e)}(x) \prod_{e' \in E_b(b(e)) \setminus \{e\}} M_c^n(x, e')$$

3. Estimation during various iterations of iterative decoding processing: this involves making best estimates of the bits of the LDPC codeword that is being decoded. This is performed using the edge messages with respect to the check nodes, $Medge_c$ (or $M_c^n$), as well as the metric, $metric_i(x)$.

The estimate at the n-th iteration is given as follows:

$$P^{(n)}(b_i = x \mid y) = metric_i(x) \prod_{e \in E_b(i)} M_c^n(x, e).$$

This LDPC decoding approach presented here clearly shows that the metric, $metric_i(x)$, is used in every iteration. Specifically, it is used at least during bit node processing and also during estimation during various iterations of iterative decoding processing. For a communication system employing LDPC coded modulation signals where every constellation signal is mapped from an m-bit symbol, the bit metric, $metric_i(x)$, can be obtained using (EQ 1A) that is shown above. This (EQ 1A), and its context, is presented again here for the ease and understanding of the reader:

It is supposed that the channel noise is AWGN with noise variance, $\sigma^2$. Then, upon receiving the symbol, y, the probability of the transition from the signal, s, in the constellation is provided as follows:

$$P_s(y \mid s) = \frac{1}{\sigma \sqrt{2\pi}} \exp\left( \frac{-1}{2\sigma^2} D_{SE}(y, s) \right) \qquad (EQ\ 1A)$$

where $D_{SE}(y,s)$ is the squared Euclidean distance between y and s.

In general, one can consider that there are two functions, $F_c$ and $F_b$, such that the function $F_c$ maps message obtained from bits to new messages which are called check-messages (i.e., edge messages with respect to the check nodes, $Medge_c$ (or $M_b^n$)). The function $F_b$ maps the check-messages and the metric of received signals to new messages which are called bit messages (i.e., edge messages with respect to the bit nodes, $Medge_c$ (or $M_b^n$)).

The set of check-messages may be defined to be $S_{CM}$; the set of bit-messages may be defined to be $S_{BM}$; and the set of bit metric to be $S_{metric}$. Then the k-th iteration of an MP (Message Passing) decoding approach may be denoted as follows:

$$S_{CM}(k)=F_c(S_{BM}(k-1)) S_{BM}(k)=F_b(S_{metric}, S_{CM}(k)) \qquad (EQ\ 4)$$

Various aspects of the invention operate to amplify (and/or adjust) the magnitude metric used within the iterative decoding processing. There may also be some advantageous applications in which reducing the magnitude metric may alternatively provide for improved performance within the iterative decoding processing.

The adjustment of the magnitude metric used within the iterative decoding processing can operate to significantly eliminate this artificial error floor that may occur when operating at higher SNRs. This approach may operate to overcome the undesirable effects of when there are oscillations within the iterative decoding processing. That is to say, when the Hamming distance between estimated codeword and the actually sent codeword does not decrease monotonously, then various aspects of the invention can operate to overcome the deleterious effects that can result during such oscillations. Moreover, this artificial error floor can be significantly lowered.

Thus, with a limited number of decoding iterations (e.g., 10 or less decoding iterations), the "artificial error floor" may occur at a higher SNR. Therefore, an LDPC decoder may be implemented to perform a large number of iterations (e.g., 100 or more). However, this iterative decoding approach may not be practical for a communication system which needs a fast and relatively lower cost LDPC decoder. Certain aspects of the invention provide a means that can significantly lower this artificial error floor.

From certain perspectives, it is also noted that certain aspects of the invention may also be implemented within communication systems that involve combining LDPC coding and modulation to generate LDPC coded modulation signals. These LDPC coded modulation signals may also be of the type that they have a code rate and/or modulation (constellation and mapping) that varies as frequently as on a frame by frame basis and/or as frequently as on a symbol by symbol basis.

Figure 4:
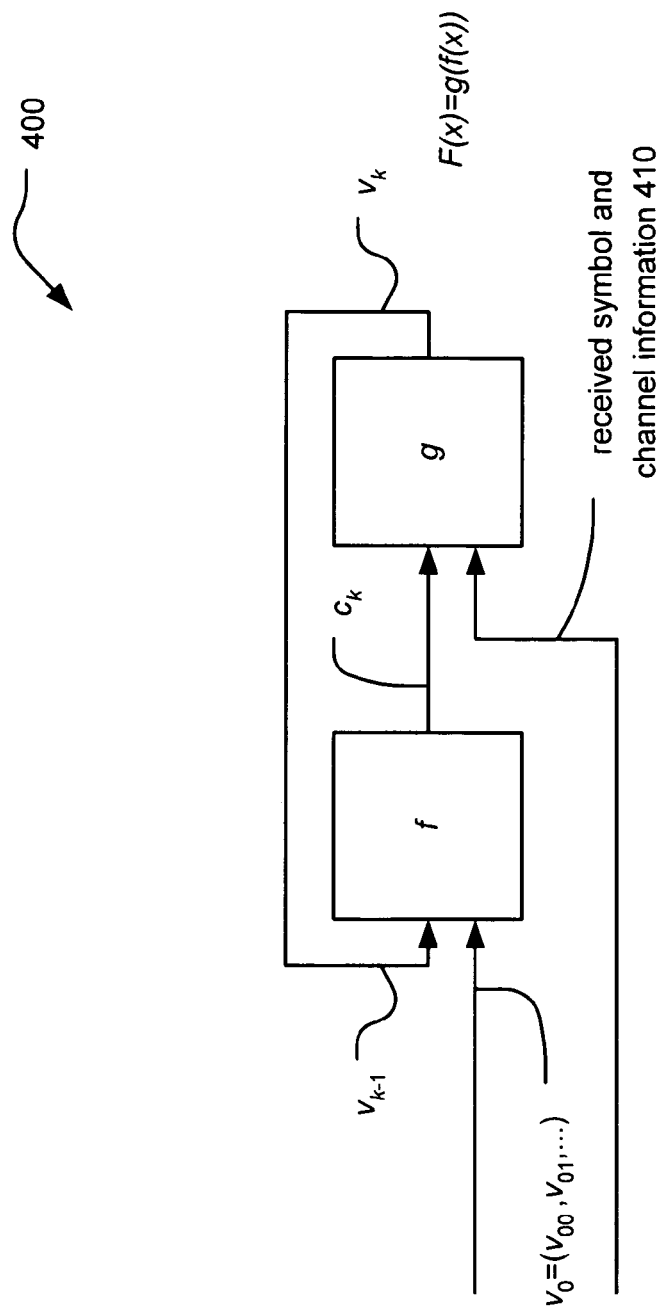
FIG. 4 is a diagram illustrating an embodiment of Sum Product (SP) (either as Belief Propagation (BP) or Message Passing (MP)) decoding functionality of decoding Low Density Parity Check (LDPC) code as finding a fixed point according to certain aspects of the invention.

FIG. 4 is a diagram illustrating an embodiment of Sum Product (SP) (either as Belief Propagation (BP) or Message Passing (MP)) decoding functionality of decoding Low Density Parity Check (LDPC) code as finding a fixed point according to certain aspects of the invention, as shown by reference numeral 400. As shown in this embodiment, one approach to perform decoding of an LDPC code is to employ the Sum-Product (SP) decoding approach. Descriptions of the SP decoding approach may be found in at least the following three references (some of which are referenced above):

[1] R. Gallager, *Low-Density Parity-Check Codes*, Cambridge, Mass.: MIT Press, 1963.

[3] T. J. Richardson and R. L. Urbanke, "The Capacity of low-density parity-check codes under message-passing decoding," *IEEE Trans. Inform. Theory*, Vol. 47, pp. 599-618, February 2001.

[4] D. J. C. MacKay, "Good error Correcting codes based on very sparse matrices," *IEEE Trans. Inform. Theory*, Vol. 45, pp. 399-431, March 1999.

In addition, a brief description of the SP decoding approach is also presented here. This brief description begins be defining a metric of a variable node, $v_i$, as follows:

$$\text{metric}_i(a) = p(y_i|v_i = a)$$

To initialize the decoding, the following definition may be employed:

$$\text{var}_e^0(a) = \text{metric}_{v(e)}(a)$$

Initially, the "Sum" portion of the SP decoding approach is performed. A check node value is calculated for each of the edges, e, of the LDPC code bipartite graph described above. These check node values may be shown mathematically as follows:

$$\text{check}_e^n(a) =$$

$$P(c_{c(e)} = 0 \mid v_{v(e)} = a, y) = \sum_{u \in U_e(a)_{e'}} \left( \prod_{e' = E_c(c(e))\setminus\{e\}} \text{var}_{e'}^{n-1}(u_{v(e')}) \right),$$

where $$U_e(a) = \left\{ u_1 \in \{0, 1\}, (t, c(e)) \in E_c(c(e))\setminus\{e\} \mid \sum_t u_t = a \right\}.$$

Subsequently, the "Product" potion of the SP decoding approach is performed. For each of the edges, e, of the LDPC code bipartite graph described above, the following calculation is made with respect to the variable nodes:

$$\text{var}_e^n(a) = P(v_{v(e)} = a \mid c_{c(e')} = 0, e' \in E_v(v(e))\setminus\{e\}, y)$$

$$\text{var}_e^n(a) = \text{metric}_{v(e)}(a) \prod_{e' \in E_v(v(e))\setminus\{e\}} \text{check}_{e'}^n(a)$$

Thereafter, the "Sum" portion and the "Product" portion of the SP decoding approach are combined together to give the final SP decoding result. Specifically, to estimate the SP decoding result after the n-th iteration, the following calculation may be performed:

$$P^{(n)}(v_i = a|y) = \text{metric}_i(a) \prod_{e \in E_v(i)} \text{check}_e^n(a)$$

The SP decoding approach is a Belief Propagation (BP) (and/or sometimes referred to as a Message-Passing (MP)) approach that is employed in a Bayesian network. The functionality performed by such as decoder may be considered as follows. The decoder starts with initial information that corresponds to all of the variable nodes; this information may be represented as a vector $v_0$. During the first SP decoding iteration, the decoder calculate the information of all the check nodes, which may be represented as the vector $c_1$, using the initial variable node information vector $v_0$. This operation may be represented as the following function: $c_1 = f(v_0)$.

After this operation, this newly computed value of $c_1$ along with the metric sequence are both used to calculate the information that corresponds to all the variable nodes, this information may be represented as a variable node vector at iteration 1, shown as $v_1$. This procedure may be denotes as the following function: $v_1 = g(c_1)$. It is also noted that the function of g also receives information corresponding to the communication channel over which a received symbol has been transmitted (as shown by received symbol and channel information 410); this information may include its noise characterization, its dispersive nature, its Signal to Noise (SNR), and/or other information as well.

The notation used herein may be defined as follows: the "variable" node information and the "check" node information in the kth iteration may be represented as $v_k$ and $c_k$, respectively. Therefore, the check node information of the kth iteration may be represented as $c_k = f(v_{k-1})$, and the variable node information of the kth iteration may be represented as $v_k=g(c_k)$. When combining these two operations together, the following notation may be employed: $v_k=g(f(v_{k-1}))$. For a more concise representation, a new function may be defined as follows: $F(x)=g(f(x))$. In addition, it can be seen that the current iteration's information of a variable node is a function of the previous iteration's information of the variable node; this may be represented mathematically as follows: $v_k=F(v_{k-1})$.

As criteria for determining when the decoding operation is in fact converging on a solution, the comparison of a current iteration's information of a variable node with the previous iteration's information of that variable node may be made. For example, when $v_k=v_{k-1}$, then the decoding processing may be viewed as having converged on a fixed point solution such that $v=v_k$ (which may also be represented as $v=F(v)$). When this criterion has in fact been met, then the final value of v will be the final output of the SP decoding approach. The following figure shows one view of this decoding processing converging on a solution.

Figure 5:
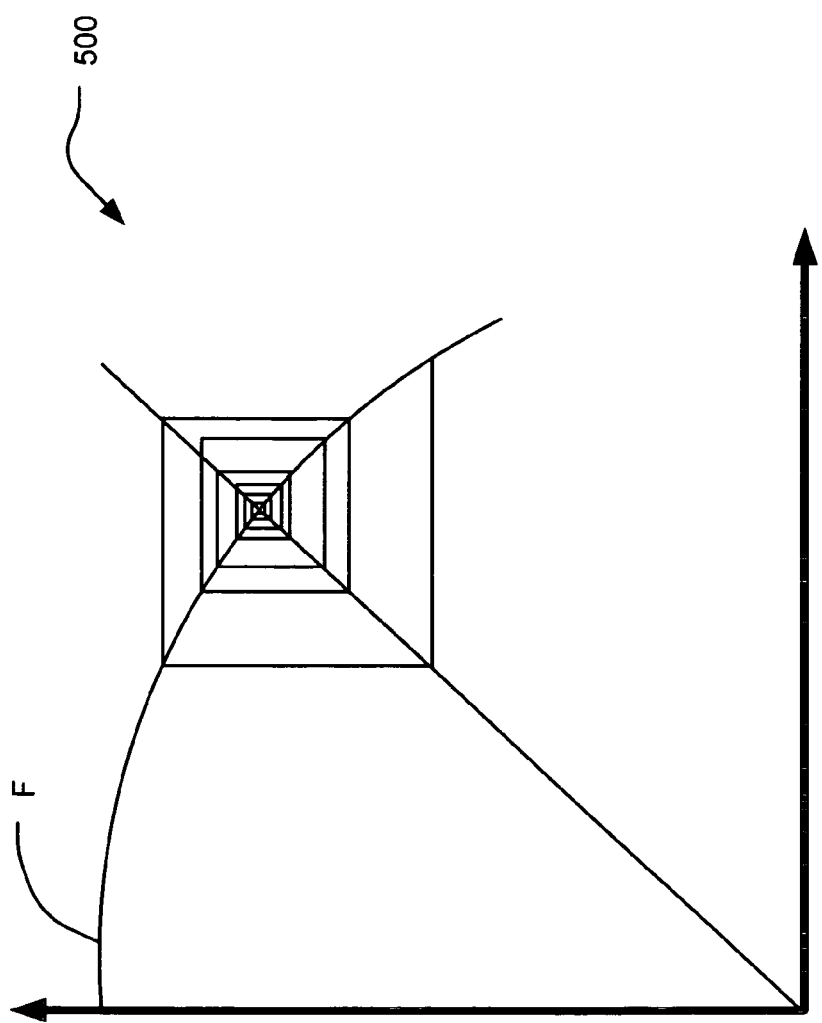
FIG. 5 is a diagram illustrating a 2-dimensional fixed point animation of decoding Low Density Parity Check (LDPC) code according to certain aspects of the invention.

FIG. 5 is a diagram illustrating a 2-dimensional fixed point animation of decoding Low Density Parity Check (LDPC) code according to certain aspects of the invention, shown by reference numeral 500. Ideally, as shown in this illustration, the difference between a current iteration's value and the previous iteration's value will continue to decrease as the total number of iterations increases. If this is the case, then the decoding processing will in fact converge on a solution.

From the iterative fix point algorithm point of view, the (EQ 1A) presented above becomes the initial conditions within the iterative decoding processing.

It is also known that the iterative decoder may cause oscillations (for some of the reasons mentioned above). There are two possible oscillation cases that may arise:

1) The output of the decoder oscillates too fast and after some iterations it converges to a wrong codeword; or 2) The output of the decoder oscillates among several codeword (one of them is the correct codeword) and it never converges to any codeword.

The above two cases cause the decoding errors and thus hurt the performance. To alter the bad behavior of 1) and 2) indicated just above, the initial conditions may be changes. To this end, the (EQ 1A) depicted above may be generalized as follows:

$$P_s(y|s) = \frac{1}{\sigma\sqrt{2\pi}} \exp\left(\frac{-1}{c\cdot\sigma^2} D_{SE}(y,s)\right)$$

where c is a coefficient, and it can be any positive real number. Moreover, let SNR (Signal to Noise Ratio) denote the signal to noise ratio and E denote the average power of a signal constellation used in modulation. Then, the noise variance is provided as follows:

$$\sigma^2 = \frac{E}{d\times SNR}$$

where d is the dimension of the constellation. With this notation, the alternative representation of (EQ 1A) presented above may be further modified to become:

$$P_s(y|s) = \frac{1}{\sigma\sqrt{2\pi}} \exp\left(\frac{-d\times SNR}{c\cdot E} D_{SE}(y,s)\right)$$

By adjusting this coefficient c according to the given LDPC code, modulation, and noise variance ($\sigma^2$), the overall performance of the decoding may be significantly improved. By doing this, the following advantageous benefits are achieved.

1) The convergence speed is slowed down so that the decoder will not go to the wrong codeword; and 2) The moving range of the outputs of the decoder is restricted so that the output will not oscillate too much and will eventually move to the correct codeword.

Several examples are provided below and also depicted pictorially in the accompanying diagrams showing the improved performance provided by certain aspects of the invention.

In the following referenced paper [5], a regular LDPC code is constructed based on two codewords of a R-S (Reed-Solomon) code.

[5] I. Djurdjevic, J. Xu, K. Abdel-Ghaffar and S. Lin, "A Class of Low-Density Parity-Check Codes Constructed Based on Reed-Solomon Codes With Two Information Symbols," *IEEE Communications Letter*, vol. 7, no. 7, pp. 317-319, July 2003.

Consider regular LDPC (1024, 833) code constructed according to the above-mentioned reference [5]. This code has bit degree 10 and check degree 32. Consider BPSK (Binary Phase Shift Key) modulation.

The following diagram shows the performances with various values of the coefficient, c.

Figure 6:
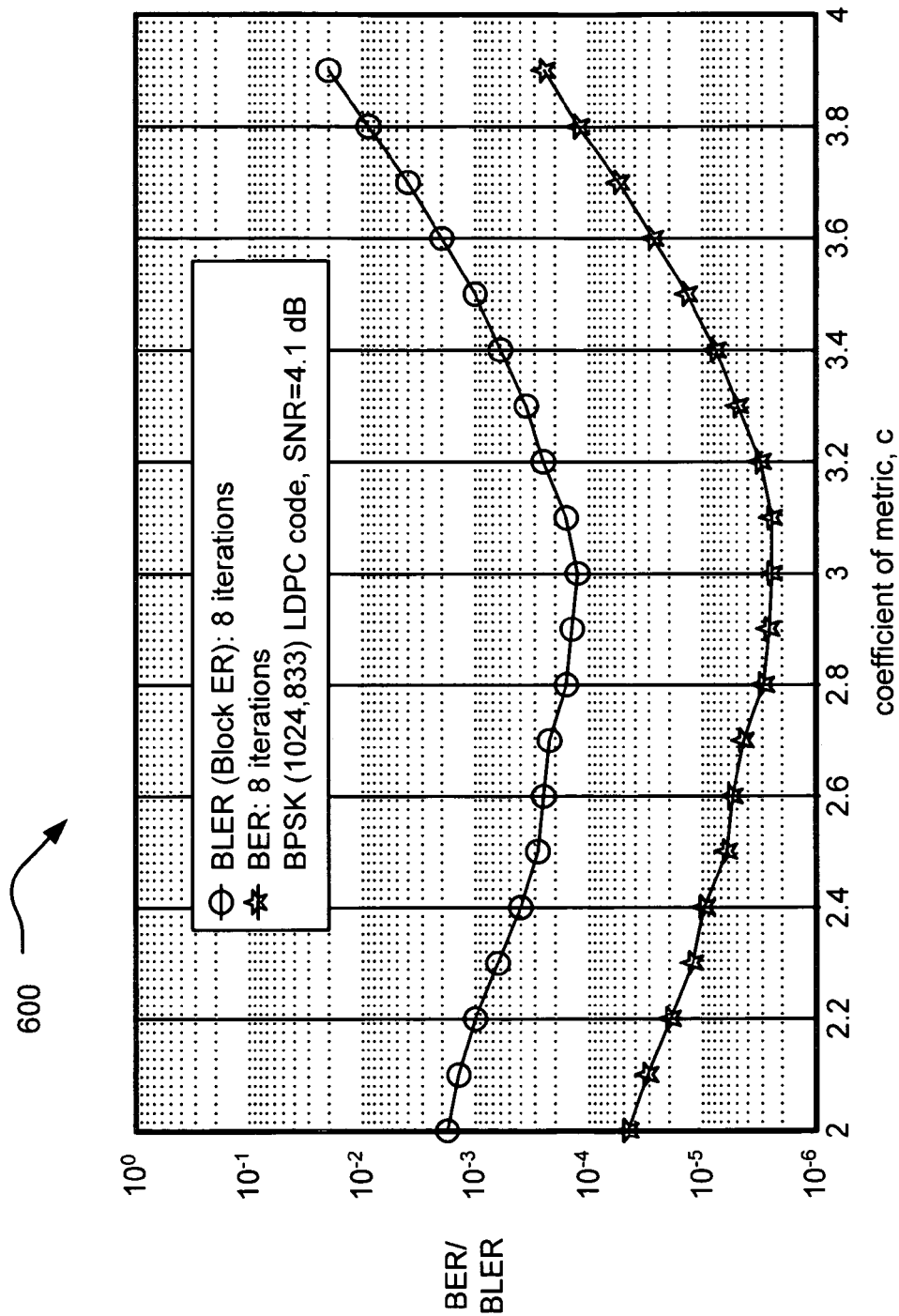
FIG. 6 is a diagram illustrating an embodiment of a BPSK (Binary Phase Shift Key) (1024, 833) code with 8 iterations at a SNR (Signal to Noise Ratio) of approximately 4.1 dB (decibels) according to certain aspects of the invention.

FIG. 6 is a diagram illustrating an embodiment 600 of a BPSK (Binary Phase Shift Key) (1024, 833) code with 8 iterations at a SNR (Signal to Noise Ratio) of approximately 4.1 dB (decibels) according to certain aspects of the invention.

This diagram shows that when c is around 3.0 to 3.2, the decoder performance better at SNR=4.1 dB. It also shows that when c≧3.6 the performance even gets worse than the standard c=2. Therefore, the use of the constant value as c=4 (as employed within the prior art as described above) is not a good option and provides for worse performance than using an appropriately selected coefficient in accordance with certain aspects of the invention.

Figure 7:
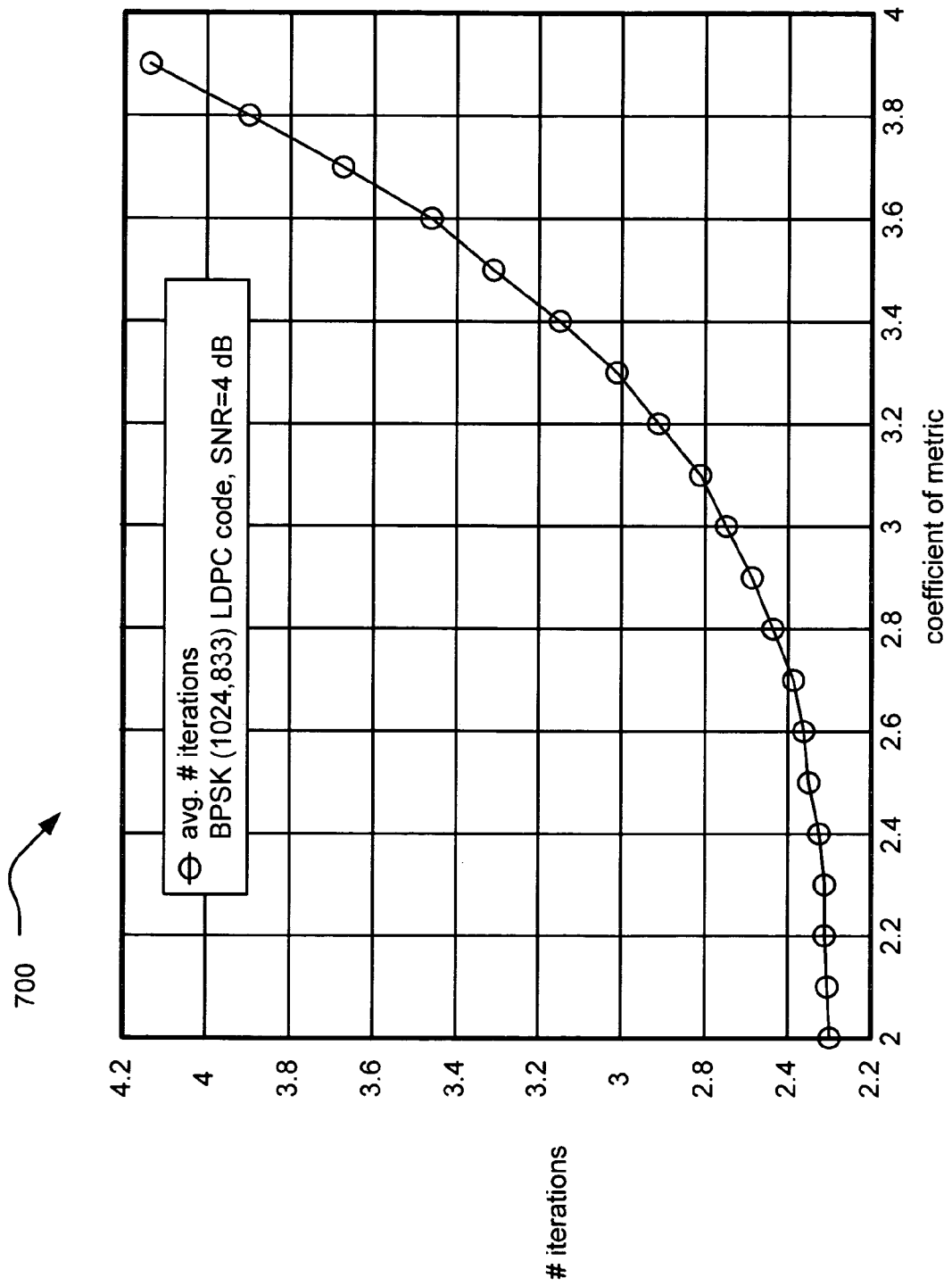
FIG. 7 is a diagram illustrating an embodiment of a number of iterations with different c for (1024, 833) BPSK at a SNR of approximately 4 dB according to certain aspects of the invention.

FIG. 7 is a diagram illustrating an embodiment 700 of a number of iterations with different c for (1024, 833) BPSK at a SNR of approximately 4 dB according to certain aspects of the invention. This diagram provides a pictorial representation of the average number of iterations that are needed to perform the decoding for different metric coefficient values, c. This diagram shows that when the metric coefficient value, c, increases, then the average number of iterations required for convergence also increases. This shows that the convergence speed of the decoder slows down when the metric coefficient value, c, become large.

Figure 8:
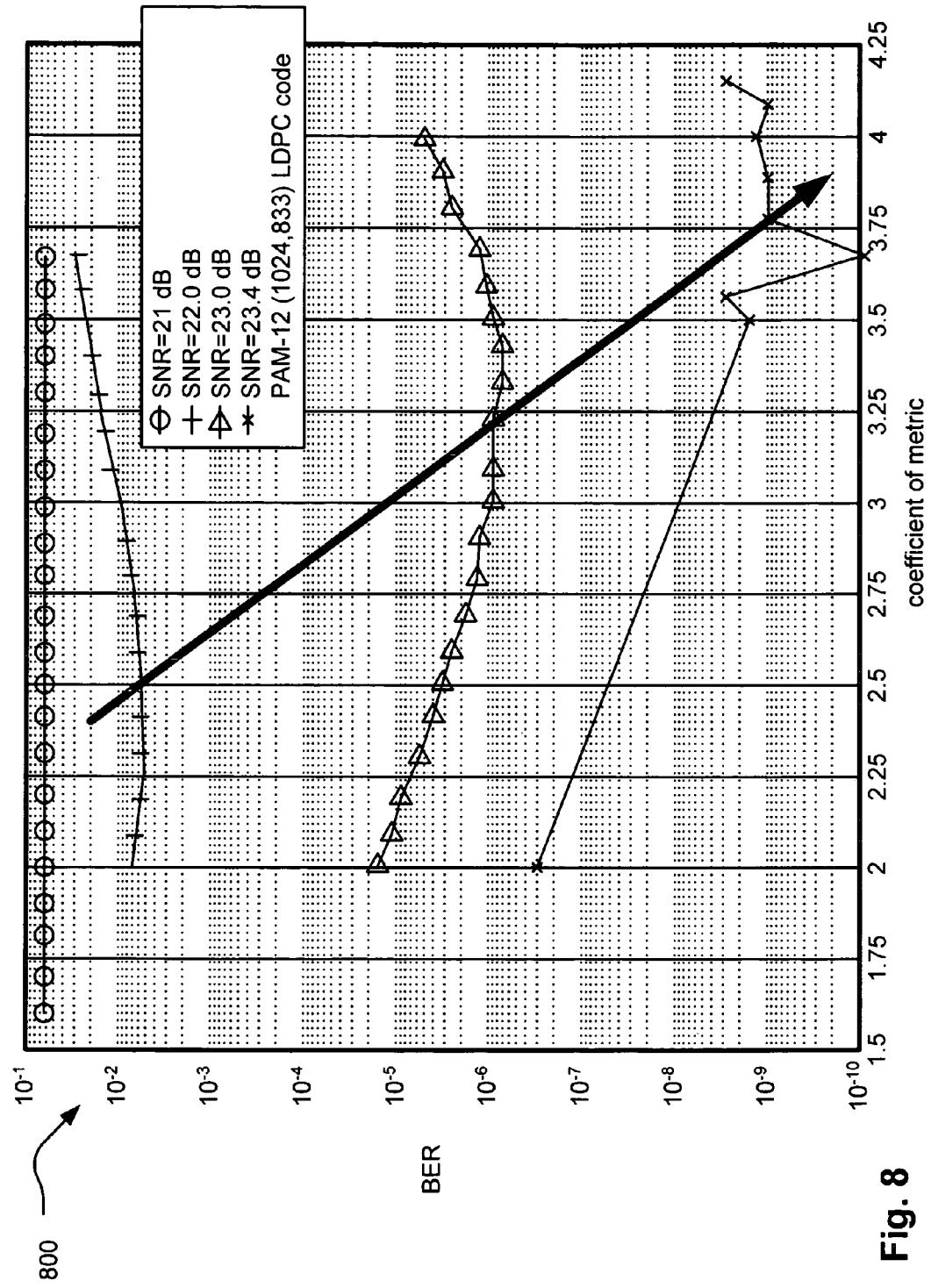
FIG. 8 is a diagram illustrating an embodiment of a BER (Bit Error Rate) vs. coefficient, c, for (1024, 833) PAM-12 (Pulse Amplitude Modulation-12) symbol mapper (e.g., using a PAM-12 constellation shape with its unique mapping) according to certain aspects of the invention.

FIG. 8 is a diagram illustrating an embodiment 800 of a BER (Bit Error Rate) vs. coefficient, c, for (1024, 833) PAM-12 (Pulse Amplitude Modulation-12) symbol mapper (e.g., using a PAM-12 constellation shape with its unique mapping) according to certain aspects of the invention. This diagram considers a (1024, 833) code but with PAM12 constellation with one ternary uncoded symbol in every signal. This diagram shows that c moves from small to larger when SNR increases.

Figure 9:
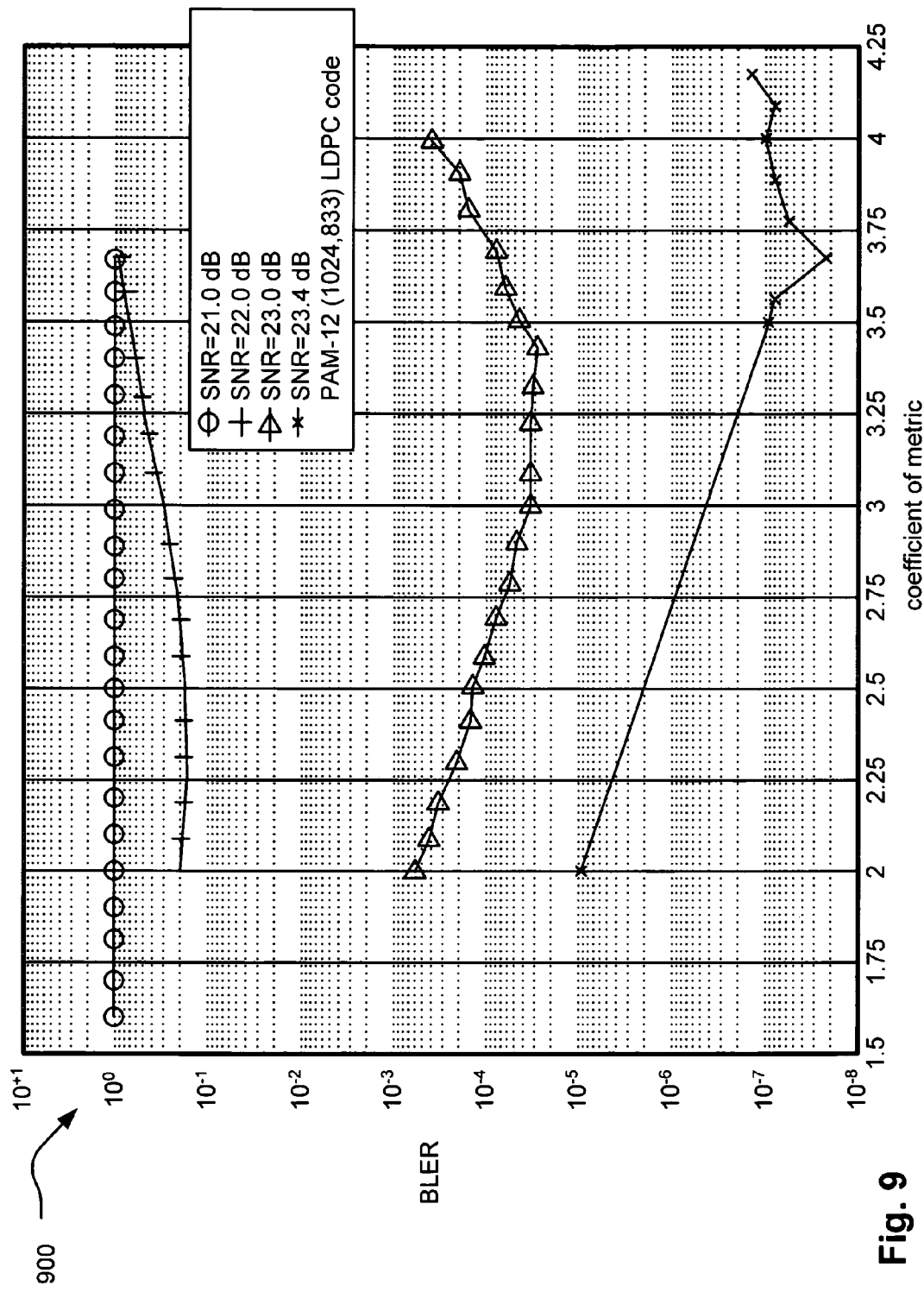
FIG. 9 is a diagram illustrating an embodiment of a BLER (Block Error Rate) vs. coefficient, c, for (1024, 833) PAM-12 according to certain aspects of the invention.

FIG. 9 is a diagram illustrating an embodiment 900 of a BLER (Block Error Rate) vs. coefficient, c, for (1024, 833) PAM-12 according to certain aspects of the invention. This diagram shows that if the metric coefficient value, c, is fixed the careful chosen, then the metric coefficient value, c, will outperform the standard metric coefficient value of c=2 at higher SNR.

Figure 10:
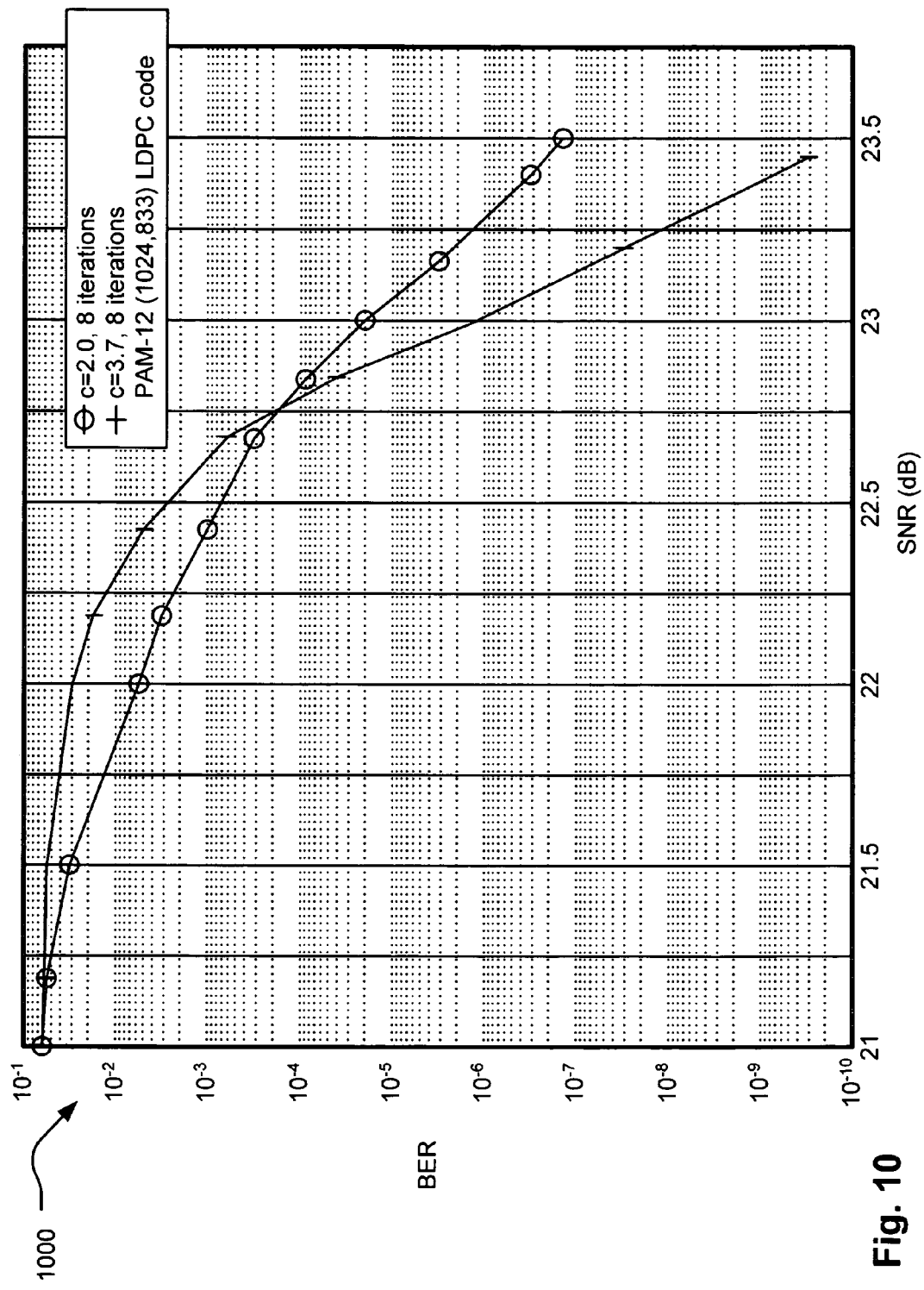
FIG. 10 is a diagram illustrating an embodiment of performance difference for c=2 and c=3.7 for ((1024, 833) PAM-12, 8 iterations) according to certain aspects of the invention.

FIG. 10 is a diagram illustrating an embodiment 1000 of performance difference for c=2 and c=3.7 for ((1024, 833) PAM-12, 8 iterations) according to certain aspects of the invention. This diagram shows how an appropriately selected metric coefficient value, c, may be employed to provide for an even lower BER when operating at various SNRs. For example, depending at which SNR a communication system is operating, different selected metric coefficient values, c, may provide for better (or worse) BER. Looking at one situation, the metric coefficient value, c=2.0, provides for a lower BER when operating at a SNR of approximately 22 dB. The metric coefficient value, c=3.7, provides for a lower BER when operating at a SNR of approximately 23 dB. When the operating conditions of a communication system are known (including the SNR), then an appropriately selected metric coefficient value, c, may be employed to provide for lower BER.

In addition, another aspect of the invention that may be employed to assist in improving the decoding of LDPC coded signals involves adjusting (e.g., amplifying in some embodiments) the metric of the received signals during the iterative decoding processing.

Amplifying Metric of Received Signals

For a given SNR (Signal to Noise Ratio) and average energy, E, of a constellation, the noise variance $\sigma^2$ of an AWGN communication channel is $$\sigma^2 = \frac{E}{SNR}.$$

Obviously, $\sigma$ decreases if the SNR increases. Thus, if $D_{SE}(y,s)$ is fixed, then the term $$\text{“}\exp\left(\frac{-1}{2\sigma^2}D_{SE}(y,s)\right)\text{”}$$

becomes smaller when the SNR increases. This may be the case even though the probability in (EQ 1A) may not be decrease since $$\frac{1}{\sigma\sqrt{2\pi}}$$

increases.

Oftentimes, in any practical communication system and/or communication device application, the calculations and computations performing during the decoding approach may all be implemented in the logarithmic domain (e.g., log domain) thereby enabling multiplication operations to be performed using addition and division operations to be performed using subtraction.

When operating in the log likelihood domain, the term $$\text{“}\frac{1}{\sigma\sqrt{2\pi}}\text{”}$$

of (EQ 1A) is oftentimes omitted and the metric of the received signal y corresponding the constellation signal s is then defined as follows:

$$q(y,s) = \exp\left(\frac{-1}{2\sigma^2}D_{SE}(y,s)\right) \quad \text{(EQ 5)}$$

In the above-mentioned reference [a] "Performance evaluation of low latency LDPC code," Katsutoshi Seki of NEC Electronic (presented in *IEEE P802.3an Task Force*, July, 2004), by using a so-called 2-dimensional noise variance in the metric computation with "1-dimensional noise" in the communication channel, a surprise performance gain at higher SNR is obtained. The so-called "2-dimensional variance" translated to the probability of the transition is provided as follows:

$$\exp\left(\frac{-1}{4\sigma^2}D_{SE}(y,s)\right) \quad \text{(EQ 6)}$$

In fact, (EQ 5) can be considered as $q(y,s)^{1/2}$. Since $q(y,s) < 1$, the following relationship holds true:

$$q(y,s)^{1/2} > q(y,s) \quad \text{(EQ 7)}$$

Therefore, the operation in (EQ 5) actually amplifies the magnitude of q(y,s). This may be viewed as being the amplification of the metric employed when performing the iterative decoding processing.

In general, the following relationship holds true:

$$q(y,s)^{1/a} > q(y,s) \text{ if } a > 1 \quad \text{(EQ 8)}$$

This factor "a" is referred to as an "amplification factor."

As mentioned previously, the q(y,s) value becomes smaller as the SNR increases. If the Euclidean distance between a received signal y to two constellation signals $s_1$ and $s_2$ are not very much different, then with a higher SNR, the absolute values difference, $|q(y,s_1)-q(y,s_2)|$, gets even smaller. This may cause the decoder to oscillate between the two signals during the iterative decoding processing. The following example shows the relationship between SNR and amplification factor (i.e., "a").

Figure 11:
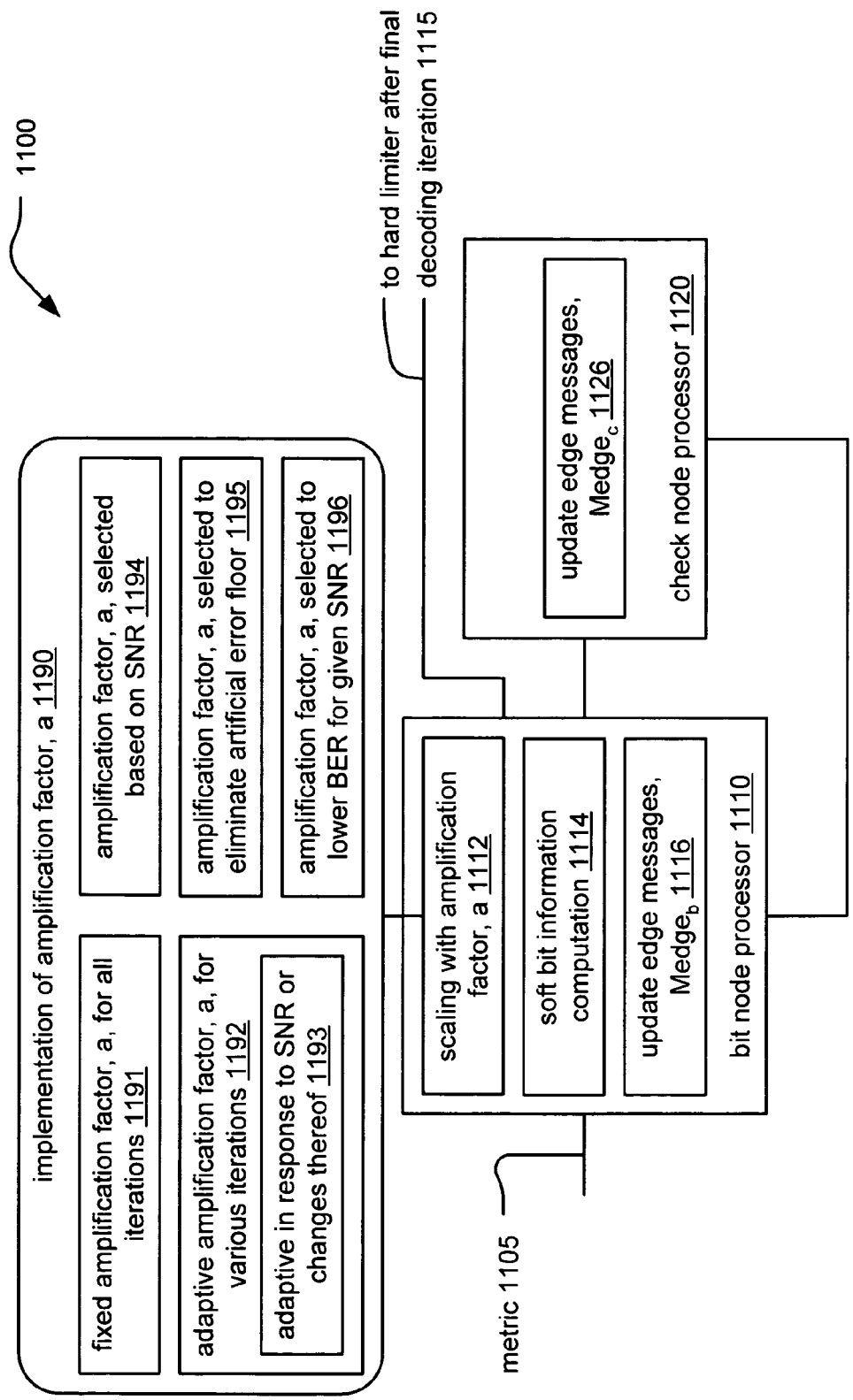
FIG. 11 is a diagram illustrating an embodiment of iterative decoding processing employing an amplification factor, a, according to certain aspects of the invention.

FIG. 11 is a diagram illustrating an embodiment of iterative decoding processing employing an amplification factor, a, according to certain aspects of the invention, shown by reference numeral 1100. Certain aspects of this embodiment are analogous and similar to other of the embodiments of decoding processing functionality that is presented above.

This embodiment shows the receipt of a metric 1105 by a bit node processor 1110. The bit node processor 1110 is operable to perform scaling of the metric 1105 with an amplification factor, a, as shown in a block 1112. In many of the embodiment presented herein, the scaling of the metric 1105 with an amplification factor, a, is referred to as being amplification. However, the invention also envisions the scaling of the metric 1105 with an amplification factor, a, that operates to decrease the "scaled" value of the metric 1105 as well without departing from the scope and spirit of the invention.

Moreover, the bit node processor 1110 is operable to perform soft bit information computation; as shown in a block 1114, using the scaled metric and a plurality of edge messages with respect to the plurality of check nodes (i.e., $\text{Medge}_c$). The bit node processor 1110 is also operable to perform update a plurality of edge messages with respect to a plurality of bit nodes (i.e., $\text{Medge}_b$) using the soft bit information and the plurality of edge messages with respect to the plurality of check nodes (i.e., $\text{Medge}_c$), as shown in a block 1116.

The updated plurality of edge messages with respect to a plurality of bit nodes (i.e., $\text{Medge}_b$) output by the bit node processor 1110 is provided to a check node processor 1120. The check node processor 1120 is operable to update the plurality of edge messages with respect to the plurality of check nodes (i.e., $\text{Medge}_c$) using the updated plurality of edge messages with respect to the plurality of bit nodes (i.e., $\text{Medge}_b$), as shown in a block 1126.

The bit node processor 1110 and the check node processor 1120 are operable cooperatively to perform iterative decoding processing during a plurality of decoding iterations. After a final decoding iteration (that can be determined as being after a final predetermined decoding iteration or after all of the syndromes pass), the most recently computed soft bit information is provided as a hard limiter, as shown by reference numeral 1115.

As shown above in other embodiment, it is again noted here that the metric (e.g., $\text{metric}_i(x)$) is employed during each and every decoding iteration with respect to the updating of the plurality of edge messages with respect to the plurality of bit nodes (i.e., $\text{Medge}_b$) as well as for the soft bit information computation. As such, the metric that has been modified using the amplification factor, a, may be employed during each of the decoding iterations. There are a variety of ways in which this may be performed. For example, a fixed amplification factor, a, may be employed for all of the decoding iterations, as shown in a block 1191.

By another embodiment, the amplification factor, a, may undergo adaptive modification for the various decoding iterations, as shown in a block 1192. For example, this adaptation of the amplification factor, a, may be performed in response to the SNR (Signal to Noise Ratio), or changes thereof, of a communication channel from which the signal being decoded has been received, as shown in a block 1193. As an example, during a first decoding iteration, when there is an $\text{SNR}_1$, a first amplification factor, $a_1$, may be employed. Thereafter, during a second decoding iteration, when there is an $\text{SNR}_2$, a second amplification factor, $a_2$, may be employed. The amplification factor, a, may undergo adaptive modification during various decoding iterations when decoding a single block of data and/or undergo adaptive modification during various decoding iterations between decoding a various blocks of data.

Generally speaking, there are a variety of ways by which the amplification factor, a, may be selected. For example, the amplification factor, a, may be selected based on the SNR, as shown in a block 1194. In addition, the amplification factor, a, may be selected to eliminate substantially an artificial noise floor characterized in terms of BER (Bit Error Rate) as a function of SNR (Signal to Noise Ratio) of a communication channel from which the LDPC coded signal is received, as shown in a block 1195. Moreover, the amplification factor, a, may be selected to decrease substantially a BER (Bit Error Rate) for a given SNR (Signal to Noise Ratio) of a communication channel from which the LDPC coded signal is received, as shown in a block 1196. In addition, there are a variety of other means by which the amplification factor, a, may be selected including to eliminate substantially oscillations that occur when decoding the LDPC coded signal, as well as other means.

Figure 12:
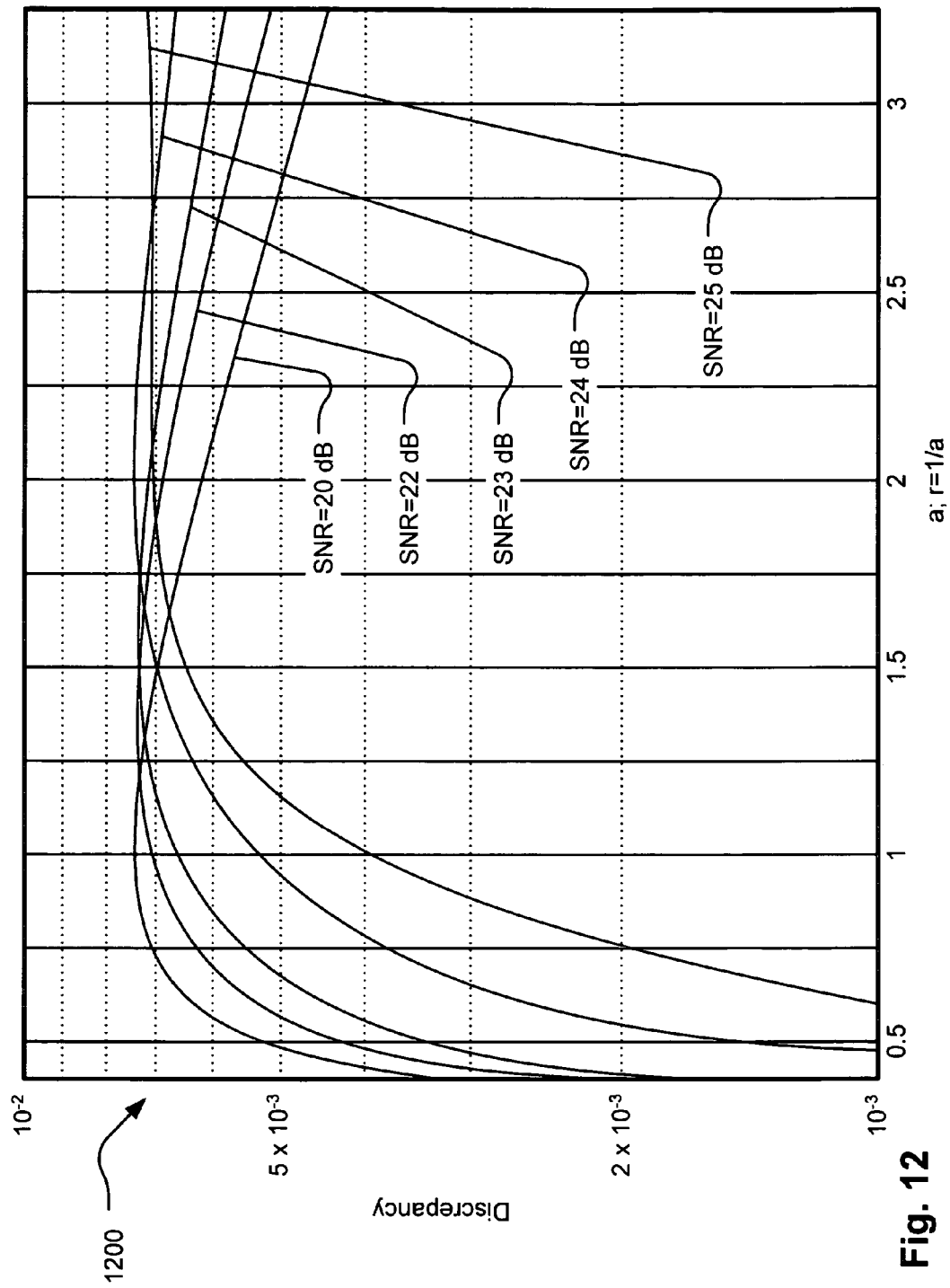
FIG. 12 is a diagram illustrating an embodiment of variation of the amplification factor, a, and the discrepancy of the q function according to certain aspects of the invention.

FIG. 12 is a diagram illustrating an embodiment 1200 of variation of the amplification factor, a, and the discrepancy of the q function according to certain aspects of the invention.

This diagram considers a 12-PAM modulation system with constellation signals $-11, -9, -7, -5, -3, -1, 1, 3, 5, 7, 9, 11$. It is supposed that y is a received signal such that the distance of y to its two nearest constellation points $s_1$ and $s_2$ are 1.005 and 0.995 respectively. The following 4 SNR cases are considered:

SNR=21 dB;

SNR=22 dB;

SNR=23 dB; and

SNR=24 dB, respectively.

The discrepancies between $q(y,s_1)^r$ and $q(y,s_2)^r$ with the difference SNR are given in this diagram. This diagram shows that, for a given SNR, there is a region of amplification factor, a, that really amplifies the discrepancy. The following table shows the best possible amplification factor, a, that amplifies the discrepancy for a given SNR.

TABLE 1

| | SNR (dB) | | | | |
|---|---|---|---|---|---|
| | 20 | 21 | 22 | 23 | 24 |
| Amplification factor, a | 1 | 1.25 | 1.75 | 2 | 2.75 |

Based on this relationship, a novel method is introduced by which the amplification factor, a, may be determined to provide for improved decoding processing.

The determination of the amplification factor, a, may be performed as follows:

1) Let u be the smallest difference between a received signal to two, say $s_1$ and $s_2$ (or more) nearest constellation signals (u=0.01 in Example 1) and then find the corresponded value y.

2) For a given SNR compute $d=|q(y,s_1)^{1/a}-q(y,s_2)^{1/a}|$ for different a. Among all possible amplification factor, a, choose the one which has the largest d (See Table 1 of Example 1).

Decoding with Amplified Metric

Previously, the amplification factor, a, is used on symbol metric q(y,s). However, most MP (Message Passing) decoding approaches use the LLR (Log-Likelihood Ratio) approach to decoding. To describe the LLR with the amplified symbol metric, two different cases are considered. One case considers a BPSK constellation, and the other case considers a constellation that has more than 2 signals.

On BPSK Constellation

Figure 13:
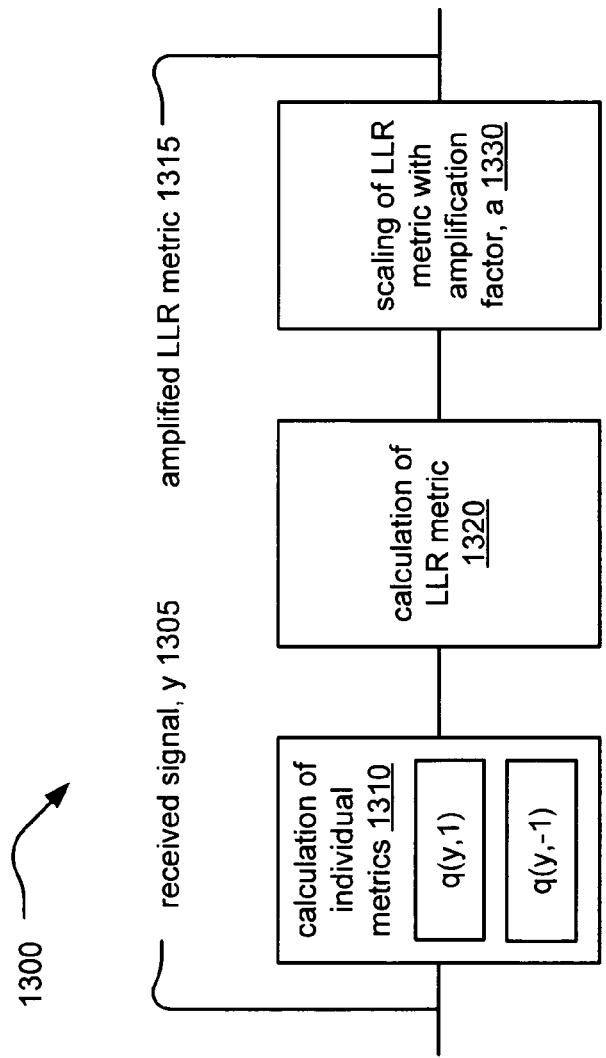
FIG. 13 is a diagram illustrating an embodiment of determination of an amplified LLR (Log-Likelihood Ratio) metric for use in iterative decoding processing of BPSK (Binary Phase Shift Key) signals according to certain aspects of the invention.

FIG. 13 is a diagram illustrating an embodiment of determination of an amplified LLR (Log-Likelihood Ratio) metric for use in iterative decoding processing of BPSK (Binary Phase Shift Key) signals according to certain aspects of the invention, as shown by reference numeral 1300.

A received signal, y, as shown by reference numeral 1305, is provided to a functional block that performs calculation of individual metrics 1310. Every signal in BPSK is mapped by one bit. For examples, consider the case where 1 is mapped by 0 and −1 is mapped by 1. Then, the following relationship holds true:

$$q(y, 1) = \exp\left(\frac{(y-1)^2}{2\sigma^2}\right), q(y, -1) = \exp\left(\frac{(y+1)^2}{2\sigma^2}\right) \quad \text{(EQ 9)}$$

Each of these values, q(y,1) and q(y,−1), is provided to a functional block that performs calculation of the LLR (Log-Likelihood Ratio) metric, as shown in a block 1320.

The LLR metric is calculated as follows:

$$llr(y) = \ln\frac{q(y, 1)}{q(y, -1)} = \frac{2}{\sigma^2}y \quad \text{(EQ 10)}$$

Thereafter, the LLR metric is scaled with an amplification factor, a, as shown in a block 1330.

$$llr(y; a) = \log\frac{q(y, 1)^{1/a}}{q(y, -1)^{1/a}} = \frac{1}{a}\log\frac{q(y, 1)}{q(y, -1)} = \frac{2}{a\sigma^2}y \quad \text{(EQ 11)}$$

Therefore, after receiving a sequence of signals ($y_0, \ldots, y_{n-1}$) the amplified LLR metric is defined as indicated by the reference numeral 1315 and as shown as follows:

$$metric_a(i) = \frac{2}{a\sigma^2}y_i, i = 0, \ldots, n-1 \quad \text{(EQ 12)}$$

On Constellations of More Than 2 Signals

Figure 14:
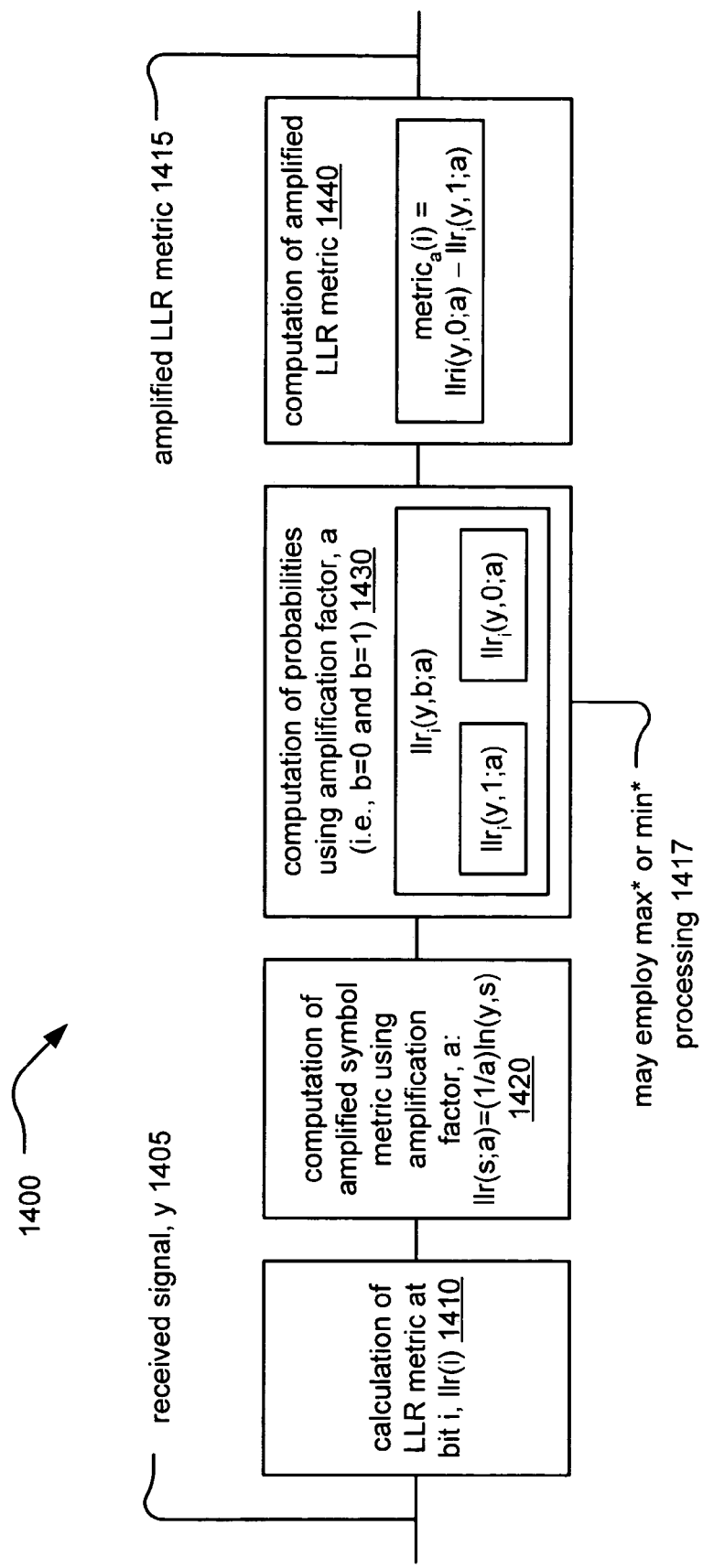
FIG. 14 and FIG. 15 are alternative diagrams illustrating embodiments of determination of an amplified LLR (Log-Likelihood Ratio) metric for use in iterative decoding processing, of signals whose constellation have more than 2 signals, according to certain aspects of the invention.
Figure 15:
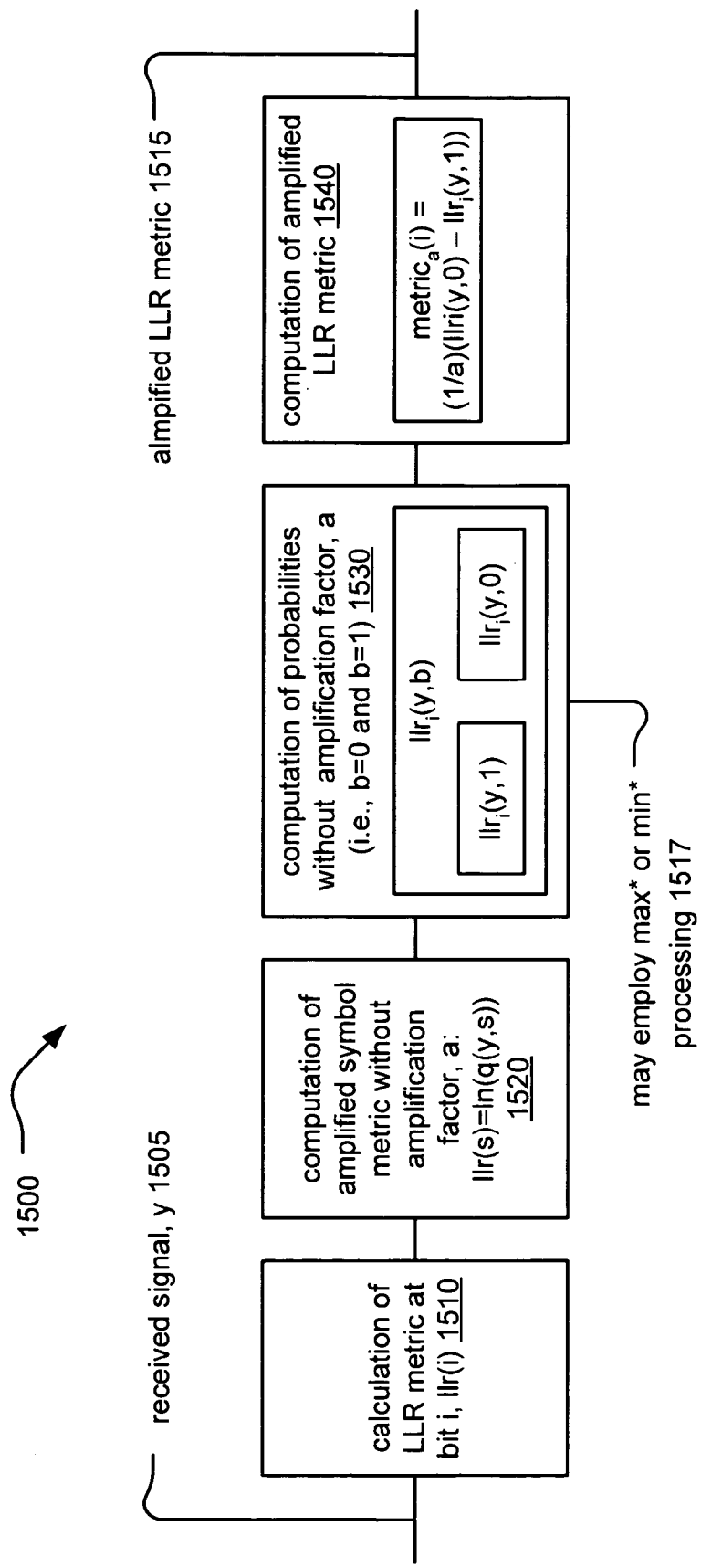

FIG. 14 and FIG. 15 are alternative diagrams illustrating embodiments of determination of an amplified LLR (Log-Likelihood Ratio) metric for use in iterative decoding processing, of signals whose constellation have more than 2 signals, according to certain aspects of the invention.

Suppose a code is used on a coded modulation system such that every m-bit (m>1) symbol is mapped to a constellation signal. Then every signal s can be represented by an m-bit binary symbol, namely ($b_0, \ldots, b_{m-1}$). Then q(y,s)=q(y, ($b_0, \ldots, b_{m-1}$)) where y is a received signal. To have a bit q function, the following is computed:

$$q_i(y, b) = \sum_{x_0=0}^{1} \ldots \sum_{x_{m-1}=0}^{1} q(y, (x_0, \ldots, x_{i-1}, x_{i+1}, \ldots x_{m-1})) \quad \text{(EQ 13)}$$

Then LLR metric at bit i is $$llr(i) = \ln\left(\frac{q_i(y, 0)}{q_i(y, 1)}\right).$$

Then one way to have amplified LLR metric is as follows:

Method I

This Method I is shown within FIG. 14 as indicated by reference numeral 1400.

Initially, a received signal, y, as shown by reference numeral 1405, is provided to a functional block that performs calculation of an LLR metric at a bit i, llr(i), as shown in a block 1410.

1) A functional block 1420 receives the LLR metric at a bit i, llr(i), and performs computation of an amplified symbol metric using an amplification factor, a. The computation of the amplified symbol metric may be performed as follows:

$$llr(s; a) = \frac{1}{a}\ln(q(y, s)).$$

2) A subsequent functional block 1430 then performs computation of the following probabilities using an amplificatory factor, a, which may be performed as follows:

$$llr_i(y, b; a) = \\ llr\left(\sum_{x_0=0}^{1} \ldots \sum_{x_{m-1}=0}^{1} \exp(llr(y, (x_0, \ldots, x_{i-1}, b, x_{i+1}, \ldots, x_{m-1}; a)))\right)$$

It is noted that these calculations may be performed using max* (max-star) or min* (min-star) processing, as shown by reference numeral 1417. The inventors have developed a number of means by which these calculations may be performed while still maintaining a high degree of accuracy when performing check node processing. These calculations include min* (min-star) processing and min*− (min-star-minus) processing. In addition, each of these processing approaches has a corresponding maximum related function: max* (max-star) processing and max*− (max-star-minus) processing. Several of these possible calculations are presented below with respect to operating on an input value "x" and an input value "y."

min* Processing and min*− Processing min*(x,y)=min(x,y)−ln(1+exp(−|x−y|))

min*−(x,y)=min(x,y)−ln(1−exp(−|x−y|))

max* Processing and max*− Processing max*(x,y)=max(x,y)+ln(1+exp(−|x−y|))

max*−(x,y)=max(x,y)+ln(1−exp(−|x−y|))

3) A subsequent functional block 1440 then performs computation of the amplified LLR metric. The amplified LLR metric may then be determined as follows:

$$metric_a(i)=llr_i(y,0;a)-llr_i(y,1;a) \quad \text{(EQ 14)}$$

The following Method II is an approximation of the Method I depicted and described above.

Method II:

This Method II is shown within FIG. 15 as indicated by reference numeral 1500.

Initially, a received signal, y, as shown by reference numeral 1505, is provided to a functional block that performs calculation of an LLR metric at a bit i, llr(i), as shown in a block 1510.

1) A functional block 1520 receives the LLR metric at a bit i, llr(i), and performs the computation of the symbol metric without using the amplification factor, a, as follows:

$$llr(s)=\ln(q(y,s));$$

2) A subsequent functional block 1530 then performs the computation of the following probabilities without using the amplificatory factor, a, which may be performed as follows:

$$llr_i(y, b) = llr\left(\sum_{x_0=0}^{1} \cdots \sum_{x_{m-1}=0}^{1} \exp(llr(y, (x_0, \ldots, x_{i-1}, b, x_{i+1}, \ldots, x_{m-1})))\right)$$

3) A subsequent functional block 1540 then performs computation of the amplified LLR metric using the amplification factor, a. The amplified LLR metric may then be determined as follows:

$$metric_a(i) = \frac{1}{a}(llr(y, 0) - llr(y, 1))$$ (EQ 15)

It is noted that the amplified metric in (EQ 14) is different to the one determined here in (EQ 15).

Iterative Decoding with Fixed Amplification Metric

As mentioned above, there are a variety of means by which the amplification factor may be employed. One such way to implement it is to employ a fixed amplification metric.

Let $S_{metric}(a)$ be the set of amplified LLR metric with amplification factor, a. Then a general iterative decoding described above 0 with the set of amplified metric is as follows:

$$S_{CM}(n)=F_c(S_{BM}(n-1))S_{BM}(n)=F_b(S_{metric}(a),S_{CM}(n))$$ (EQ 16)

Here, the Method I introduced previously is employed as the metric amplification approach within the following performance comparisons.

Figure 16:
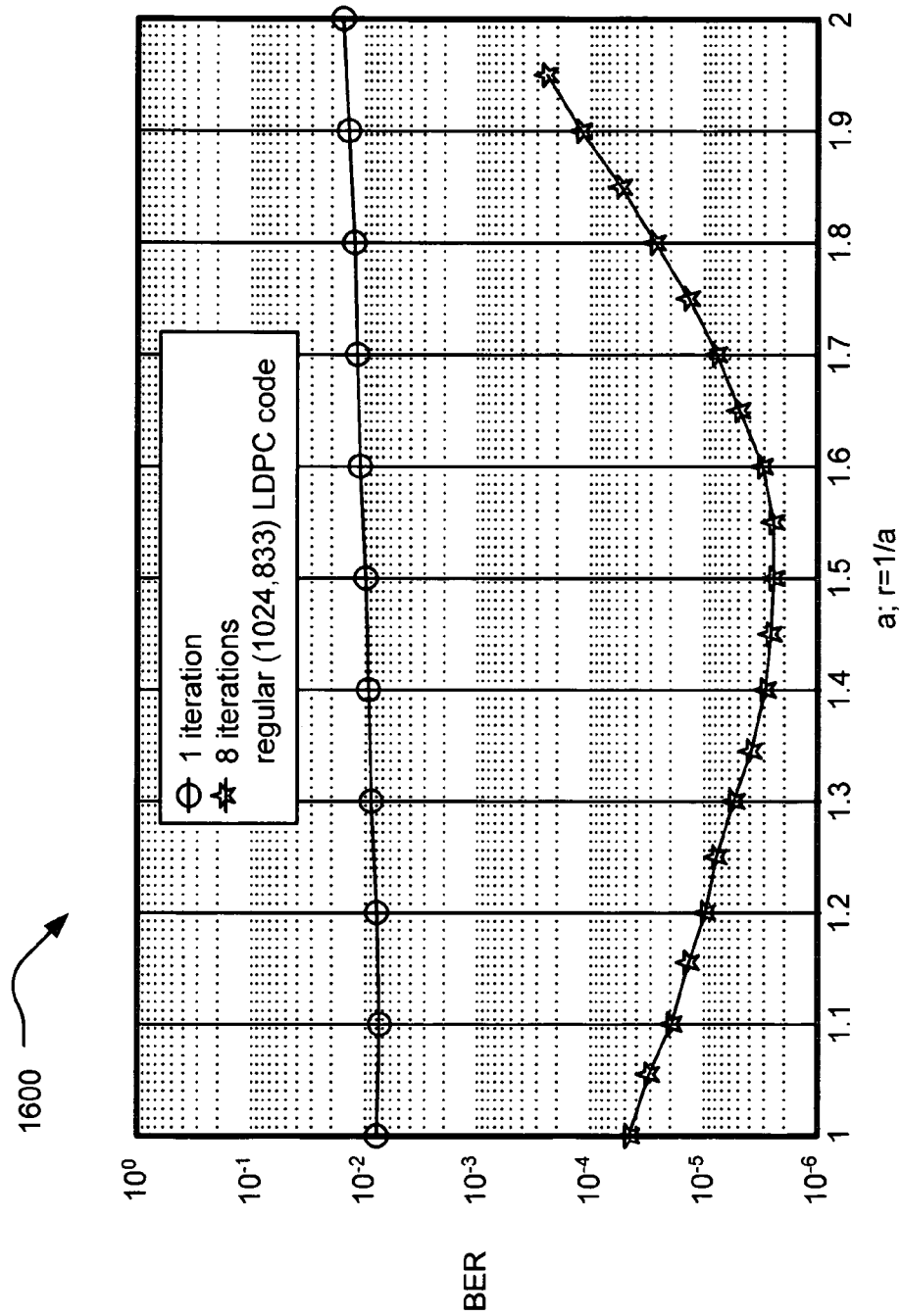
FIG. 16 is a diagram illustrating an embodiment of BER (Bit Error Rate) achieved when decoding a regular LDPC (1024, 833) code having BPSK (Binary Phase Shift Key) modulation as a function of amplification factor, a, according to certain aspects of the invention.

FIG. 16 is a diagram illustrating an embodiment 1600 of BER (Bit Error Rate) achieved when decoding a regular LDPC (1024, 833) code having BPSK (Binary Phase Shift Key) modulation as a function of amplification factor, a, according to certain aspects of the invention.

This diagram considers a regular LDPC (1024, 833) code constructed as described in [a] "Performance evaluation of low latency LDPC code," Katsutoshi Seki of NEC Electronic (presented in *IEEE P802.3an Task Force*, July, 2004) (which has been also mentioned above).

This example considers a BPSK constellation, and this diagram shows the simulation results of this LDPC code with different values of amplification factor, a. When considering this diagram, it can be seen see that although amplifying metric, a, may not help decoding that is performed without more than one decoding iteration, it does in fact help the iterative decoding processing considerably. Moreover, this diagram shows the best amplification factor a is around 1.45 to 1.6 for SNR=4.1 dB. However, when a≧1.8 amplification may not be a good idea. This is consistent to the results of the previous example as well.

The following diagram considers the average number of iterations that are needed when decoding using different values of amplification factor, a.

Figure 17:
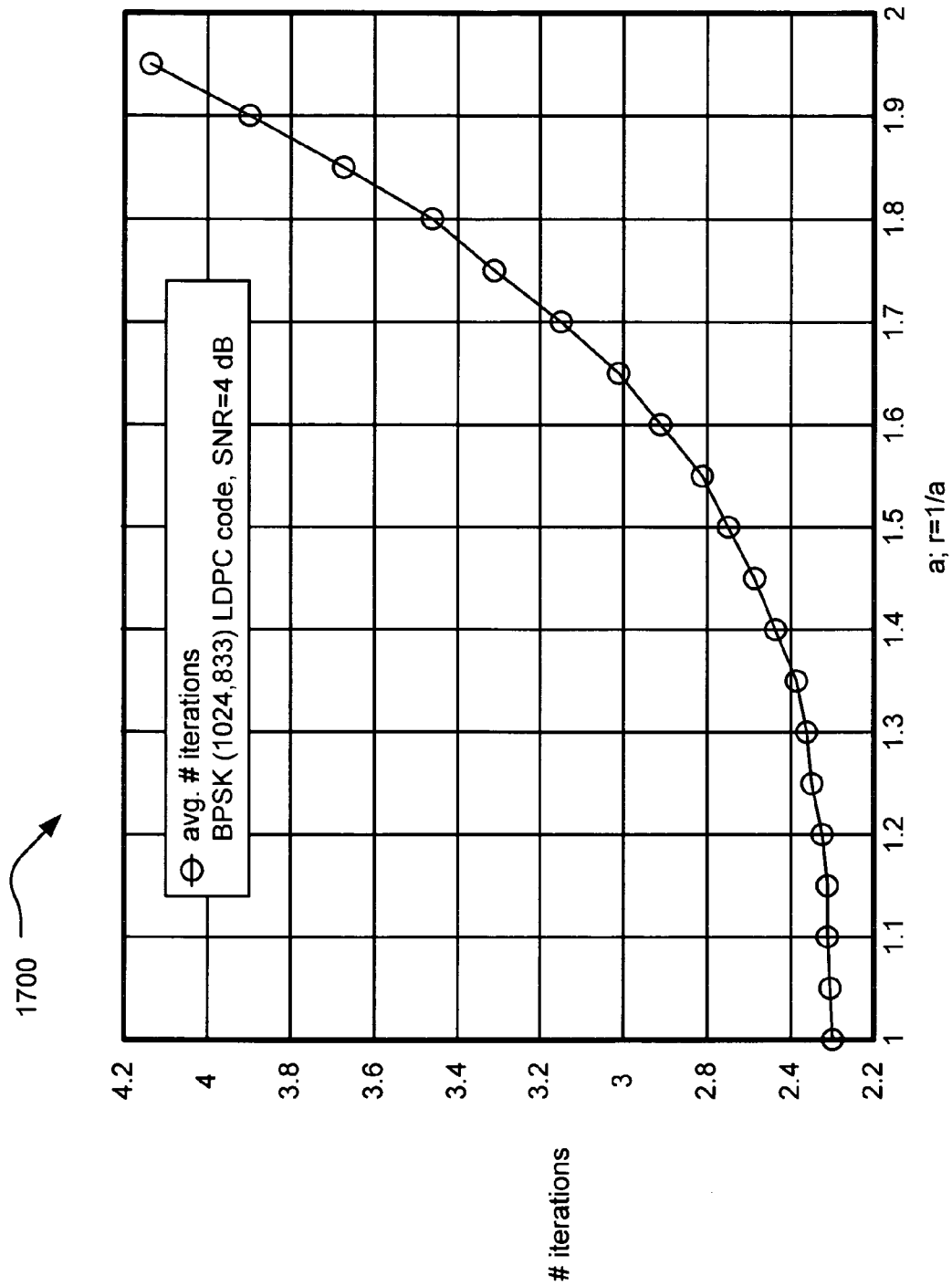
FIG. 17 is a diagram illustrating an embodiment of the number of decoding iterations employed with different amplification factors, a, for a regular LDPC (1024, 833) code having BPSK modulation, at a SNR of 4 dB, according to certain aspects of the invention.

FIG. 17 is a diagram illustrating an embodiment 1700 of the number of decoding iterations employed with different amplification factors, a, for a regular LDPC (1024, 833) code having BPSK modulation, at a SNR of 4 dB, according to certain aspects of the invention.

This diagram shows that when the amplification factor, a, increases, then the average number of decoding iterations that are required for the decoding to converge on a solution increases. This shows that the convergence speed of the decoder slows down when the amplification factor, a, becomes large.

Figure 18:
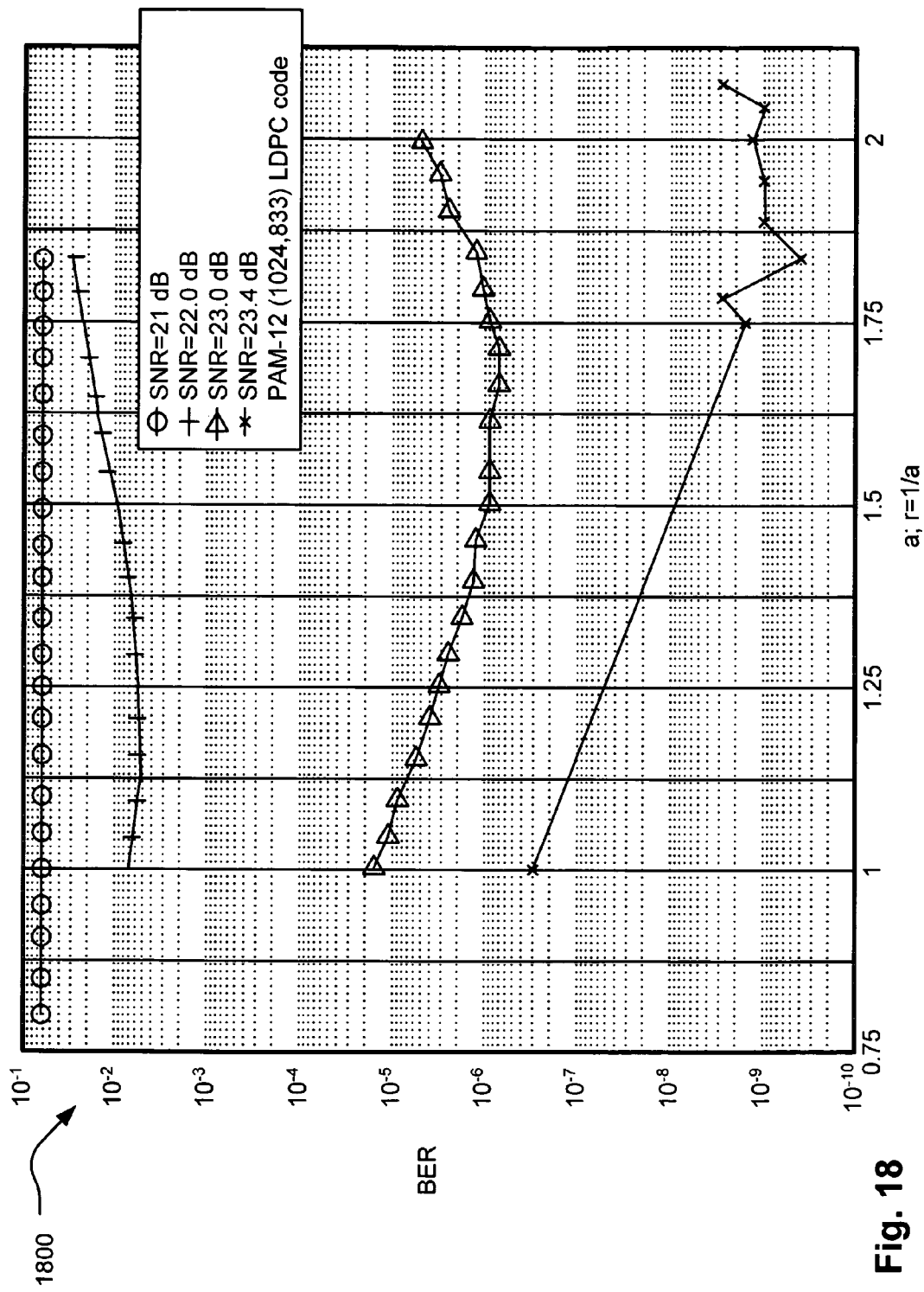
FIG. 18 is a diagram illustrating an embodiment of BER achieved when decoding a regular LDPC (1024, 833) code having PAM-12 (Pulse Amplitude Modulation-12) as a function of amplification factor, a, according to certain aspects of the invention.

FIG. 18 is a diagram illustrating an embodiment 1800 of BER achieved when decoding a regular LDPC (1024, 833) code having PAM-12 (Pulse Amplitude Modulation-12) as a function of amplification factor, a, according to certain aspects of the invention.

This diagram considers a regular LDPC (1024, 833) code with 12-PAM constellation. This regular LDPC (1024, 833) code is described in [a] "Performance evaluation of low latency LDPC code," Katsutoshi Seki of NEC Electronic (presented in *IEEE P802.3an Task Force*, July, 2004).

In this diagram, every 12 PAM signal contains one ternary uncoded symbol and two LDPC coded bits. This diagram shows that, in order to have better performance when SNR increases, the amplification factor, a, should also be increased. This conclusion is also consistent with the other examples provided above.

Figure 19:
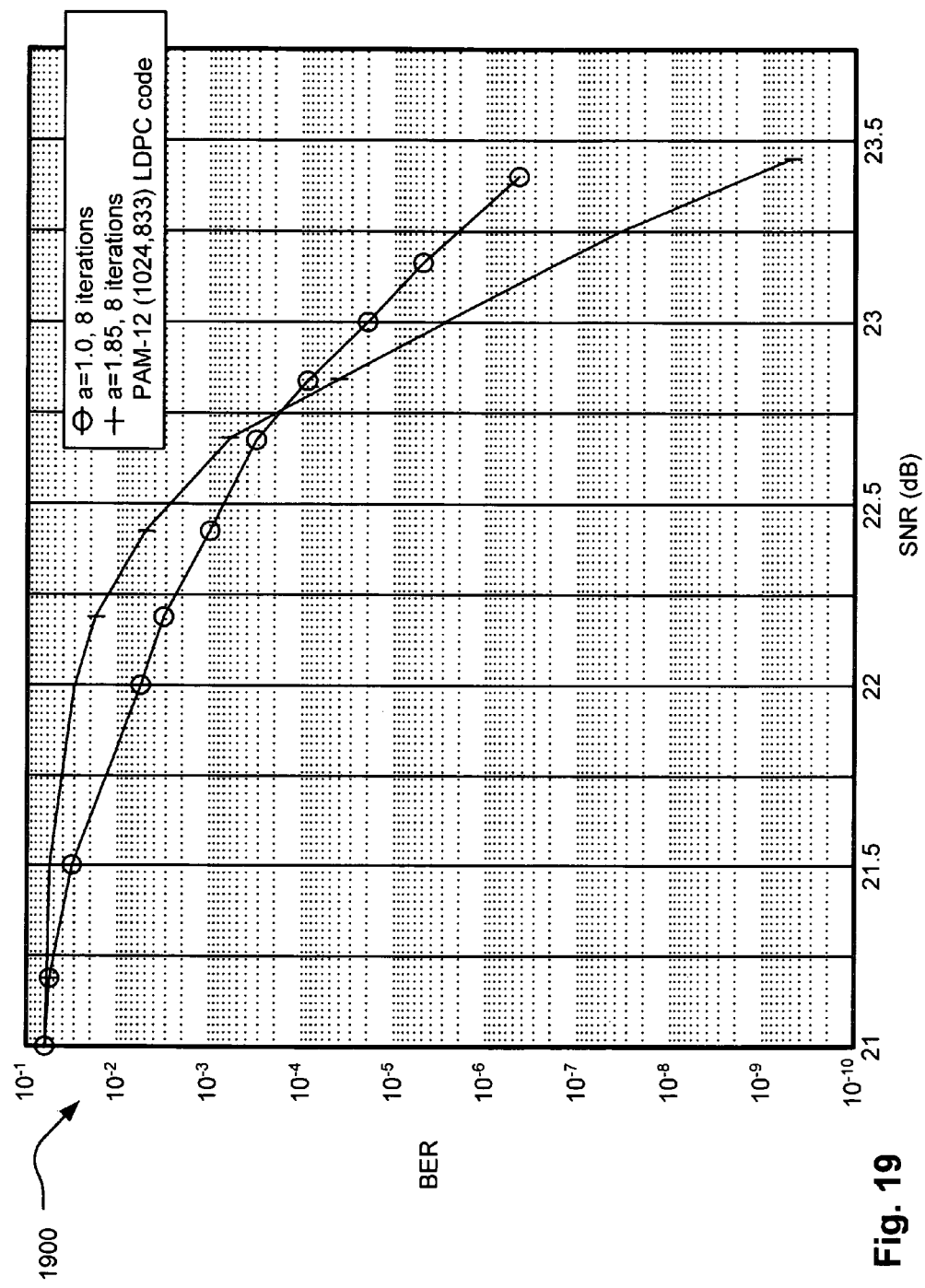
FIG. 19 is a diagram illustrating an embodiment of a performance comparison of different amplification factor values, a, when decoding a regular LDPC (1024, 833) code having PAM-12 for a predetermined number of iterations according to certain aspects of the invention.

FIG. 19 is a diagram illustrating an embodiment 1900 of a performance comparison of different amplification factor values, a, when decoding a regular LDPC (1024, 833) code having PAM-12 for a predetermined number of iterations according to certain aspects of the invention.

In this diagram, two amplification factors are fixed values.
1) amplification factor: a=1 which gives the performance of the standard MP (Message Passing) decoder; and
2) amplification factor: a=1.85.

This diagram shows that when SNR<22.7 dB, then the decoder with the amplification factor of a=1 outperforms the decoder with the amplification factor of a=1.85. However, when SNR>22.7, then the decoder with the amplification factor of a=1.85 outperforms the decoder with the amplification factor of a=1.

It is well known that although iterative decoding gives near Shannon limit performance, it causes the error floor to occur at lower BERs for many codes including Turbo codes and LDPC codes. The following shows that the amplification metric, a, can help to move error floor further down when decoding such coded signals.

This example considers a regular LDPC (2048, 1723) code that is described in [a] "Performance evaluation of low latency LDPC code," Katsutoshi Seki of NEC Electronic (presented in *IEEE P802.3an Task Force*, July, 2004).

This LDPC. code is decoded with an 8-iteration MP (Message Passing) decoding approach. If the metric is not amplified, then the error floor starts around BER=1×10$^{-11}$. This performance is shown within FIG. 20 for an 8-PAM constellation.

Now, the amplification factor, a, is set to be 1.64 but a Double square QAM (DSQ) constellation is employed.

Figure 20:
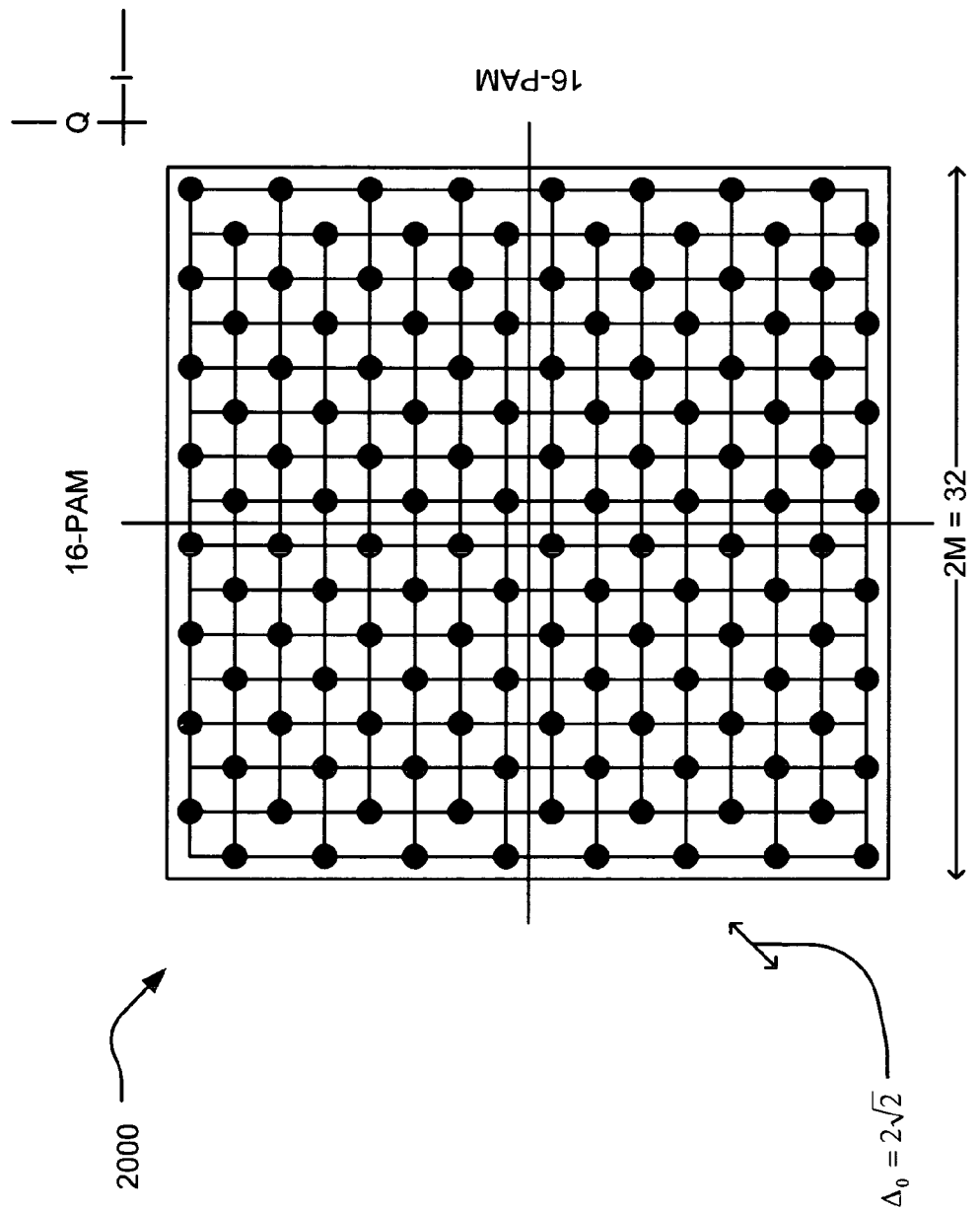
FIG. 20 is a diagram illustrating an embodiment of a 128 double square QAM constellation.

FIG. 20 is a diagram illustrating an embodiment 2000 of a 128 double square QAM constellation.

In the following reference [6], a similar constellation but with 32 constellation points is presented:

[6] L. F. Wei, "Generalized square and Hexagonal constellations for intersymbol-interference channels with generalized Tomlinson-Harashima precoders," *IEEE Trans. on Communications*, Vol. 42, No. 9, September 1994, pp. 2713-2721.

In this disclosure, this principle is extended and generalized to include 128 constellation points and it is referred to as a 128 double square QAM (DSQ) constellation. The minimum Euclidean distance of the DSQ constellation is $\Delta_0=2\sqrt{2}$.

Figure 21:
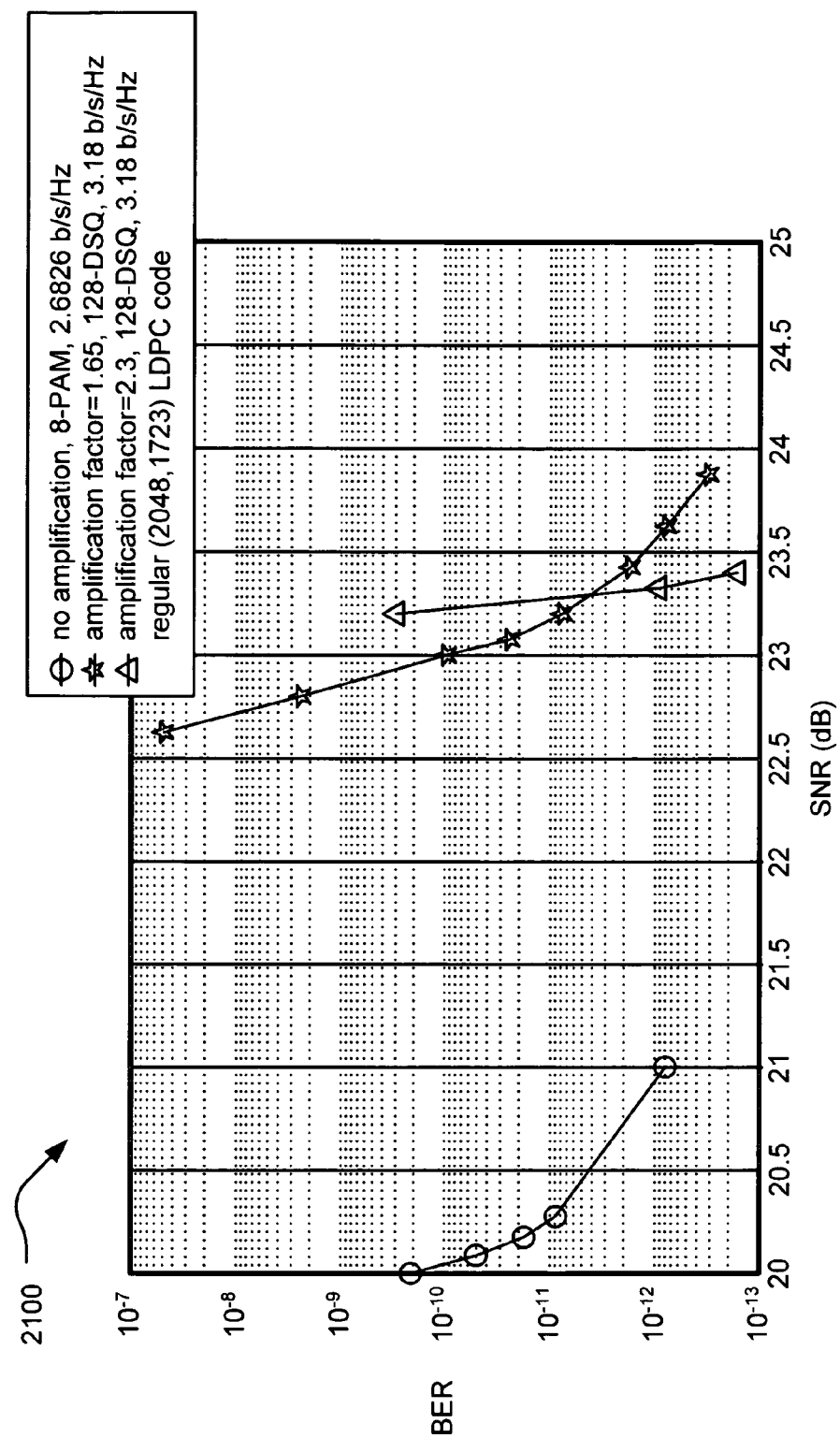
FIG. 21 is a diagram illustrating an embodiment of a performance comparison of the impact of different amplification factor values, a, on error floor according to certain aspects of the invention.

FIG. 21 is a diagram illustrating an embodiment 2100 of a performance comparison of the impact of different amplification factor values, a, on error floor according to certain aspects of the invention.

In this diagram, it can be seen that the error floor starts around BER=1×10$^{-12}$. Furthermore, if the amplification factor is modified to be 2.3, and the 128 DSQ constellation is again used, then the error floor does not even start at BER=1×10$^{-13}$. All of these performance comparisons show that using an amplification metric, a, may delay the occurrence of the error floor.

Adaptively Adjusting Metric (e.g. Adaptively Amplifying Metric in Some Embodiments)

Above, (EQ 6) shows that every decoding iteration of the MP decoding approach uses the metric. Therefore, employing the amplifying metric in every iteration step with a different amplification factor may also help to provide for even more improved decoding performance. The amplification factor ay be selected during different decoding iterations based on any number of factors including SNR (Signal to Noise Ratio) of the communication channel over which the signal is transmitted, to environmental conditions (e.g., noise, temperature, humidity, etc), and other operating conditions.

This would involve modifying the amplification factor, a, during various decoding iterations (rather that employing a constant amplification factor, a, during all decoding iterations).

Let $S_{metric}(a_i)$ be a set of bit metrics with the amplification factor, $a_i$. Then the adaptive amplification iterative MP decoding approach can be denoted as follows:

$$S_{CM}(k)=F_c(S_{BM}(k-1))S_{BM}(k)=F_b(S_{metric}(a_k),S_{CM}(k)) \quad \text{(EQ 17)}$$

where k is the iteration number.

Again, it is noted that while many of the various embodiments depict the scaling of the metric using an amplification factor, a, such that the metric is actually scaled up in value, it is again noted that alternative embodiments may provide for the use of an amplification factor, a, such that the metric is actually scaled down in value. The choice of which way to scale the metric is made available for a designer in view of the particular application context in which such functionality and/or processing is to be implemented.

It is also noted that any methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to decode an LDPC (Low Density Parity Check) coded signal that is generated according to an LDPC code having a corresponding LDPC bipartite graph that includes bit nodes and check nodes selectively connected via edges, the decoder comprising:
a bit node processor that is operable to:
   receive a metric that corresponds to a bit of the LDPC coded signal;
   scale the metric using an amplification factor;
   compute soft bit information, corresponding to the bit of the LDPC coded signal, using the scaled metric and a plurality of edge messages with respect to the plurality of check nodes; and
   update a plurality of edge messages with respect to a plurality of bit nodes using the soft bit information and the plurality of edge messages with respect to the plurality of check nodes; and
a check node processor that is operable to update the plurality of edge messages with respect to the plurality of check nodes using the updated plurality of edge messages with respect to the plurality of bit nodes.

2. The decoder of claim 1, further comprising:
a hard limiter that is operable to make a hard decision on the soft bit information thereby generating a best estimate of the bit of the LDPC coded signal.

3. The decoder of claim 1, further comprising:
a hard limiter that is operable to make a hard decision on the soft bit information thereby generating a best estimate of the bit of the symbol of the LDPC coded signal; and
a syndrome calculation functional block that is operable to determine whether each of a plurality of syndromes of the LDPC code by which the LDPC coded signal is generated is substantially equal to zero within a degree of precision using the hard decision.

4. The decoder of claim 1, wherein:
the bit node processor and the check node processor are operable cooperatively to perform iterative decoding processing during a plurality of decoding iterations; and
the bit node processor is operable to scale the metric using the amplification factor during each decoding iteration of the plurality of decoding iterations.

5. The decoder of claim 1, wherein:
the bit node processor and the check node processor are operable cooperatively to perform iterative decoding processing during a plurality of decoding iterations;
during a first decoding iteration, the bit node processor scales the metric using the amplification factor; and
during a second decoding iteration, the bit node processor scales the metric using at least one additional amplification factor.

6. The decoder of claim 1, wherein:
the amplification factor is selected based on a SNR (Signal to Noise Ratio) of a communication channel from which the LDPC coded signal is received.

7. The decoder of claim 1, wherein:
the bit node processor and the check node processor are operable cooperatively to perform iterative decoding processing during a plurality of decoding iterations;
during a first decoding iteration, the bit node processor is operable to scale the metric using the amplification factor such that the amplification factor is selected based on a SNR (Signal to Noise Ratio) of a communication channel from which the LDPC coded signal is received; and
during a second decoding iteration, the bit node processor scales the metric using at least one additional amplification factor such that the at least one additional amplification factor is selected based on a change in the SNR of the communication channel from which the LDPC coded signal is received.

8. The decoder of claim 1, wherein:
the amplification factor is selected to eliminate substantially an artificial noise floor characterized in terms of BER (Bit Error Rate) as a function of SNR (Signal to Noise Ratio) of a communication channel from which the LDPC coded signal is received.

9. The decoder of claim 1, wherein:
the amplification factor is selected to decrease substantially a BER (Bit Error Rate) for a given SNR (Signal to Noise Ratio) of a communication channel from which the LDPC coded signal is received.

10. The decoder of claim 1, wherein:
the amplification factor is selected to eliminate substantially oscillations that occur when decoding the LDPC coded signal.

11. The decoder of claim 1, wherein:
the decoder is operable to decode LDPC coded signals that are compliant with recommended practices provided by IEEE (Institute of Electrical & Electronics Engineers) P802.3an (10GBASE-T) Task Force.

12. A decoder that is operable to decode an LDPC (Low Density Parity Check) coded signal that is generated according to an LDPC code having a corresponding LDPC bipartite graph that includes bit nodes and check nodes selectively connected via edges, the decoder comprising:
a metric generator that is operable to:
receive a I, Q (In-phase, Quadrature) values corresponding to a symbol of the LDPC coded signal;
calculate a plurality of symbol metrics that corresponds to the symbol of the LDPC coded signal;
a symbol node calculator functional block that is operable to calculate a plurality of bit metrics using the plurality symbol metrics;
a bit node processor that is operable to:
receive a bit metric, of the plurality of bit metrics, that corresponds to a bit of the LDPC coded signal;
scale the bit metric using an amplification factor;
compute soft bit information, corresponding to a bit of the LDPC coded signal, using the scaled bit metric and a plurality of edge messages with respect to the plurality of check nodes; and
update a plurality of edge messages with respect to a plurality of bit nodes using the soft bit information and the plurality of edge messages with respect to the plurality of check nodes; and
a check node processor that is operable to update the plurality of edge messages with respect to the plurality of check nodes using the updated plurality of edge messages with respect to the plurality of bit nodes; and
a hard limiter that is operable to make a hard decision on the soft bit information thereby generating a best estimate of the bit of the symbol of the LDPC coded signal.

13. The decoder of claim 12, further comprising:
a syndrome calculation functional block that is operable to determine whether each of a plurality of syndromes of the LDPC code by which the LDPC coded signal is generated is substantially equal to zero within a degree of precision using the hard decision.

14. The decoder of claim 12, wherein:
the bit node processor and the check node processor are operable cooperatively to perform iterative decoding processing during a plurality of decoding iterations;
during a first decoding iteration, the bit node processor is operable to scale the bit metric using the amplification factor; and
during a second decoding iteration, the bit node processor is operable to scale the bit metric using at least one additional amplification factor.

15. The decoder of claim 12, wherein:
the amplification factor is selected based on a SNR (Signal to Noise Ratio) of a communication channel from which the LDPC coded signal is received.

16. The decoder of claim 12, wherein:
the bit node processor and the check node processor are operable cooperatively to perform iterative decoding processing during a plurality of decoding iterations;
during a first decoding iteration, the bit node processor is operable to scale the metric using the amplification factor that is selected based on a SNR (Signal to Noise Ratio) of a communication channel from which the LDPC coded signal is received; and
during a second decoding iteration, the bit node processor is operable to scale the metric using at least one additional amplification factor that is selected based on a change in the SNR of the communication channel from which the LDPC coded signal is received.

17. The decoder of claim 12, wherein:
the amplification factor is selected to eliminate substantially an artificial noise floor characterized in terms of BER (Bit Error Rate) as a function of SNR (Signal to Noise Ratio) of a communication channel from which the LDPC coded signal is received.

18. The decoder of claim 12, wherein:
the amplification factor is selected to decrease substantially a BER (Bit Error Rate) for a given SNR (Signal to Noise Ratio) of a communication channel from which the LDPC coded signal is received.

19. The decoder of claim 12, wherein:
the amplification factor is selected to eliminate substantially oscillations that occur when decoding the LDPC coded signal.

20. The decoder of claim 12, wherein:
the decoder is operable to decode LDPC coded signals that are compliant with recommended practices provided by IEEE (Institute of Electrical & Electronics Engineers) P802.3an (10GBASE-T) Task Force.

21. A method for decoding an LDPC (Low Density Parity Check) coded signal that is generated according to an LDPC code having a corresponding LDPC bipartite graph that includes bit nodes and check nodes selectively connected via edges, the method comprising:
receiving a metric that corresponds to a bit of the LDPC coded signal, wherein the bit corresponds to a bit node of the plurality of bit nodes;
scaling the metric using an amplification factor;
computing soft bit information using the scaled metric and a plurality of edge messages with respect to the plurality of check nodes;
updating a plurality of edge messages with respect to a plurality of bit nodes using the soft bit information and the plurality of edge messages with respect to the plurality of check nodes;
updating the plurality of edge messages with respect to the plurality of check nodes using the updated plurality of edge messages with respect to the plurality of bit nodes; and
making a hard decision on the soft bit information thereby generating a best estimate of the bit of the LDPC coded signal.

22. The method of claim 21, further comprising:
determining whether each of a plurality of syndromes of the LDPC code by which the LDPC coded signal is generated is substantially equal to zero within a degree of precision using the hard decision.

23. The method of claim 21, further comprising:
performing iterative decoding processing during a plurality of decoding iterations; and
scaling the metric using the amplification factor during each decoding iteration of the plurality of decoding iterations.

24. The method of claim 21, further comprising:
performing iterative decoding processing during a plurality of decoding iterations;
during a first decoding iteration, scaling the metric using the amplification factor; and
during a second decoding iteration, scaling the metric using at least one additional amplification factor.

25. The method of claim 21, further comprising:
selecting the amplification factor based on a SNR (Signal to Noise Ratio) of a communication channel from which the LDPC coded signal is received.

26. The method of claim 21, further comprising:
selecting the amplification factor to eliminate substantially an artificial noise floor characterized in terms of BER (Bit Error Rate) as a function of SNR (Signal to Noise Ratio) of a communication channel from which the LDPC coded signal is received.

27. The method of claim 21, further comprising:
selecting the amplification factor to decrease substantially a BER (Bit Error Rate) for a given SNR (Signal to Noise Ratio) of a communication channel from which the LDPC coded signal is received.

28. The method of claim 21, further comprising:
selecting the amplification factor to eliminate substantially oscillations that occur when decoding the LDPC coded signal.

* * * * *